(12) United States Patent
Johnston et al.

(10) Patent No.: US 12,133,327 B2
(45) Date of Patent: Oct. 29, 2024

(54) PATTERNED ARTICLE INCLUDING ELECTRICALLY CONDUCTIVE ELEMENTS

(71) Applicant: 3M INNOVATIVE PROPERTIES COMPANY, St. Paul, MN (US)

(72) Inventors: Raymond P. Johnston, Lake Elmo, MN (US); John J. Sullivan, Hudson, WI (US); Matthew C. Messina, Maplewood, MN (US); Charles D. Hoyle, Stillwater, MN (US); Jaewon Kim, Woodbury, MN (US); Haiyan Zhang, Lake Elmo, MN (US); Matthew S. Stay, Bloomington, MN (US); Robert A. Sainati, Bloomington, MN (US); Kevin W. Gotrik, Hudson, WI (US); Kenneth A. P. Meyer, Eagan, MN (US); Gregory L. Abraham, Austin, TX (US); Joseph C. Carls, Austin, TX (US); Douglas S. Dunn, Woodbury, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 333 days.

(21) Appl. No.: 17/602,659

(22) PCT Filed: May 5, 2020

(86) PCT No.: PCT/US2020/031450
§ 371 (c)(1),
(2) Date: Oct. 8, 2021

(87) PCT Pub. No.: WO2020/227280
PCT Pub. Date: Nov. 12, 2020

(65) Prior Publication Data
US 2022/0183153 A1 Jun. 9, 2022

Related U.S. Application Data

(60) Provisional application No. 62/843,739, filed on May 6, 2019.

(51) Int. Cl.
*H05K 1/02* (2006.01)
*H01Q 1/38* (2006.01)
(Continued)

(52) U.S. Cl.
CPC ............ *H05K 1/0296* (2013.01); *H01Q 1/38* (2013.01); *H05K 1/0353* (2013.01);
(Continued)

(58) Field of Classification Search
None
See application file for complete search history.

(56) References Cited

U.S. PATENT DOCUMENTS

| 4,990,827 A | 2/1991 | Ehrfeld |
| 5,476,211 A | 12/1995 | Khandros |

(Continued)

FOREIGN PATENT DOCUMENTS

| CN | 102063951 | 5/2011 |
| CN | 106374197 | 2/2017 |

(Continued)

OTHER PUBLICATIONS

Li, "The rise of conductive copper inks: challenges and perspectives", Applied Materials Today, Mar. 2020, vol. 18, 26 pages.
(Continued)

*Primary Examiner* — Timothy J Thompson
*Assistant Examiner* — John B Freal
(74) *Attorney, Agent, or Firm* — Clifton F. Richardson

(57) ABSTRACT

A patterned article includes a unitary polymeric layer and a plurality of electrically conductive elements embedded at
(Continued)

least partially in the unitary polymeric layer. Each electrically conductive element includes a conductive seed layer having a top major surface and an opposite bottom major surface in direct contact with the unitary polymeric layer, and includes a metallic body disposed on the top major surface of the conductive seed layer. The metallic body has a bottom major surface and at least one sidewall. The bottom major surface contacts the conductive seed layer. Each sidewall is in direct contact with the unitary polymeric layer and extends from the bottom major surface of the metallic body toward or to, but not past, a top major surface of the unitary polymeric layer. The conductive elements may be electrically isolated from one another. Processes for making the patterned article are described.

20 Claims, 14 Drawing Sheets

(51) Int. Cl.
*H05K 1/03* (2006.01)
*H05K 3/00* (2006.01)
*H05K 3/10* (2006.01)
*H05K 3/20* (2006.01)
*H05K 3/24* (2006.01)
*H05K 3/46* (2006.01)

(52) U.S. Cl.
CPC ............ *H05K 3/0014* (2013.01); *H05K 3/103* (2013.01); *H05K 3/207* (2013.01); *H05K 3/244* (2013.01); *H05K 3/4644* (2013.01); *H05K 2201/09118* (2013.01); *H05K 2203/0108* (2013.01); *H05K 2203/0152* (2013.01); *H05K 2203/0156* (2013.01); *H05K 2203/0723* (2013.01)

(56) References Cited

U.S. PATENT DOCUMENTS

| | | | |
|---|---|---|---|
| 5,601,740 A | 2/1997 | Eldridge |
| 5,900,738 A | 5/1999 | Khandros |
| 5,917,707 A | 6/1999 | Khandros |
| 5,926,951 A | 7/1999 | Khandros |
| 5,985,153 A | 11/1999 | Dolan |
| 5,993,665 A | 11/1999 | Terstappen |
| 6,013,188 A | 1/2000 | Terstappen |
| 6,136,182 A | 10/2000 | Dolan |
| 6,184,587 B1 | 2/2001 | Khandros |
| 6,242,803 B1 | 6/2001 | Khandros |
| 6,274,823 B1 | 8/2001 | Khandros |
| 6,278,618 B1 | 8/2001 | Lee |
| 6,279,227 B1 | 8/2001 | Khandros |
| 6,400,018 B2 | 6/2002 | Clatanoff |
| 6,476,333 B1 | 11/2002 | Khandros |
| 6,660,159 B1 | 12/2003 | Terstappen |
| 6,929,849 B2 | 8/2005 | Koskenmaki |
| 7,018,713 B2 | 3/2006 | Padiyath |
| 7,084,656 B1 | 8/2006 | Khandros |
| 7,476,326 B2 | 1/2009 | Ahn |
| 7,521,292 B2 | 4/2009 | Rogers |
| 7,524,464 B2 | 4/2009 | Ahn |
| 7,557,367 B2 | 7/2009 | Rogers |
| 7,601,269 B2 | 10/2009 | Ahn |
| 7,622,367 B1 | 11/2009 | Nuzzo |
| 7,666,308 B2 | 2/2010 | Scholtens |
| 7,799,699 B2 | 9/2010 | Nuzzo |
| 7,943,491 B2 | 5/2011 | Nuzzo |
| 7,998,854 B2 | 8/2011 | Viswanadam |
| 8,018,563 B2 | 9/2011 | Jones |
| 8,039,847 B2 | 10/2011 | Nuzzo |
| 8,198,621 B2 | 6/2012 | Rogers |
| 8,217,381 B2 | 7/2012 | Rogers |
| 8,329,573 B2 | 12/2012 | Viswanadam |
| 8,384,691 B2 | 2/2013 | Frey |
| 8,394,706 B2 | 3/2013 | Nuzzo |
| 8,658,248 B2 | 2/2014 | Anderson |
| 8,754,396 B2 | 6/2014 | Rogers |
| 8,906,491 B2 | 12/2014 | Staub |
| 9,105,555 B2 | 8/2015 | Rogers |
| 9,105,867 B2 | 8/2015 | Verschuuren |
| 9,164,607 B2 | 10/2015 | Frey |
| 9,229,553 B2 | 1/2016 | Weaver |
| 9,437,782 B2 | 9/2016 | Bower |
| 9,444,015 B2 | 9/2016 | Bower |
| 9,468,050 B1 | 10/2016 | Rotzoll |
| 9,500,888 B2 | 11/2016 | Schwartz |
| 9,515,025 B2 | 12/2016 | Rogers |
| 9,519,080 B2 | 12/2016 | Cok |
| 9,520,537 B2 | 12/2016 | Bower |
| 9,698,308 B2 | 7/2017 | Bower |
| 9,780,438 B2 | 10/2017 | Kuehler |
| 9,799,719 B2 | 10/2017 | Cok |
| 9,899,465 B2 | 2/2018 | Bower |
| 9,991,423 B2 | 6/2018 | Bower |
| 10,204,864 B2 | 2/2019 | Rogers |
| 10,224,460 B2 | 3/2019 | Bower |
| 10,431,719 B2 | 10/2019 | Cok |
| 10,446,719 B2 | 10/2019 | Bower |
| 10,833,225 B2 | 11/2020 | Bower |
| 2002/0012248 A1 | 1/2002 | Campbell |
| 2005/0067286 A1 | 3/2005 | Ahn |
| 2005/0079333 A1 | 4/2005 | Wheatley |
| 2005/0232817 A1 | 10/2005 | Ahn |
| 2006/0087602 A1 | 4/2006 | Kunisada |
| 2007/0119614 A1 | 5/2007 | Shimoishizaka |
| 2008/0095988 A1 | 4/2008 | Frey |
| 2009/0051620 A1 | 2/2009 | Ishibashi |
| 2009/0152215 A1 | 6/2009 | Ahn |
| 2009/0219257 A1* | 9/2009 | Frey ............... G06F 3/0446 |
| | | | 178/18.05 |
| 2009/0236627 A1 | 9/2009 | Kim |
| 2009/0303125 A1 | 12/2009 | Caille |
| 2009/0321364 A1 | 12/2009 | Spaid |
| 2010/0103521 A1 | 4/2010 | Smith |
| 2010/0270057 A1 | 10/2010 | Yanagimoto |
| 2010/0316852 A1 | 12/2010 | Condo |
| 2013/0264390 A1* | 10/2013 | Frey ............... C23F 1/02 |
| | | | 235/492 |
| 2014/0057058 A1 | 2/2014 | Yapel |
| 2014/0110040 A1 | 4/2014 | Cok |
| 2014/0204294 A1 | 7/2014 | Lv |
| 2014/0216065 A1 | 8/2014 | Jarrett |
| 2014/0308477 A1 | 10/2014 | Derks |
| 2015/0085460 A1 | 3/2015 | Frey |
| 2015/0109674 A1 | 4/2015 | Cok |
| 2015/0138151 A1 | 5/2015 | Moran |
| 2015/0279688 A1 | 10/2015 | Cok |
| 2015/0285956 A1 | 10/2015 | Schmidt |
| 2016/0170101 A1 | 6/2016 | Kivel |
| 2016/0240276 A1 | 8/2016 | Yokoyama |
| 2017/0248741 A1 | 8/2017 | Hao |
| 2019/0020122 A1 | 1/2019 | Hester |
| 2020/0013720 A1 | 1/2020 | Rogers |
| 2020/0016879 A1 | 1/2020 | Gotrik |

FOREIGN PATENT DOCUMENTS

| | | |
|---|---|---|
| EP | 2124514 A1 | 11/2009 |
| JP | 2000-124580 | 4/2000 |
| JP | 2006-084673 | 3/2006 |
| JP | 2012-019205 | 1/2012 |
| JP | 2018-098446 | 6/2018 |
| WO | WO 2017-145706 | 8/2017 |
| WO | WO 2018-178802 | 10/2018 |

(56) References Cited

FOREIGN PATENT DOCUMENTS

WO    WO 2018-178803    10/2018
WO    WO 2020-225731    11/2020

OTHER PUBLICATIONS

International Search Report for PCT International Application No. PCT-US2020-031450, mailed on Jul. 21, 2020, 3 pages.

\* cited by examiner

PATTERNED ARTICLE INCLUDING ELECTRICALLY CONDUCTIVE ELEMENTS

CROSS REFERENCE TO RELATED APPLICATIONS

This application is a national stage filing under 35 U.S.C. 371 of PCT/US2020/031450, filed May 5, 2020, which claims the benefit of provisional Application No. 62/843,739, filed May 6, 2019, the disclosures of which are incorporated by reference in their entirety herein.

BACKGROUND

An article useful as an antenna, EMI shield, or touch sensor may include a micropattern of conductive traces formed on a substrate by photolithography.

SUMMARY

The present disclosure relates generally to patterned articles that include electrically conductive elements. The electrically conductive elements may be electrically isolated from one another or may be electrically connected to one another only by virtue of one or more busbars.

In some aspects of the present disclosure, a patterned article is provided. The patterned article includes a unitary polymeric layer and a plurality of electrically conductive elements embedded at least partially in the unitary polymeric layer and being electrically isolated from one another. Each electrically conductive element includes a conductive seed layer having a top major surface and an opposite bottom major surface in direct contact with the unitary polymeric layer, and includes a metallic body disposed on the top major surface of the conductive seed layer. The metallic body has a bottom major surface and a least one sidewall. The bottom major surface contacts the conductive seed layer. Each sidewall is in direct contact with the unitary polymeric layer and extends from the bottom major surface of the metallic body toward or to, but not past, a top major surface of the unitary polymeric layer.

In some aspects of the present disclosure, a patterned article is provided. The patterned article includes a unitary polymeric layer extending along orthogonal first and second directions, and a plurality of electrically conductive elements embedded at least partially in the unitary polymeric layer and extending along the first direction. The electrically conductive elements are electrically connected to one another only by virtue of one or more busbars extending along the second direction and embedded at least partially in the unitary polymeric layer such that for each busbar, each of the electrically conductive elements is disposed on a same side of the busbar or sub-pluralities of the electrically conductive elements are disposed on opposing sides of the busbar. Each electrically conductive element includes a conductive seed layer having a top major surface and an opposite bottom major surface in direct contact with the unitary polymeric layer, and includes a metallic body disposed on the top major surface of the conductive seed layer. The metallic body has a bottom major surface and at least one sidewall. The bottom major surface contacts the conductive seed layer. Each sidewall is in direct contact with the unitary polymeric layer and extends from the bottom major surface of the metallic body toward or to, but not past, a top major surface of the unitary polymeric layer.

In some aspects of the present disclosure, a process of making a patterned article is provided. The process includes providing a tool including at least one raised portion; disposing a conductive layer on a top surface of a first portion of the at least one raised portion such that at least a majority of a total area of side surfaces of the first portion of the at least one raised portion is free of the conductive layer; disposing a polymer or polymer precursor onto the tool after the disposing the conductive layer step; solidifying the polymer or polymer precursor to form a polymeric layer comprising at least one cavity corresponding to the at least one raised portion; removing the polymeric layer and the conductive layer from the tool such that the conductive layer is disposed at a bottom surface of the at least one cavity; depositing conductive material into the at least one cavity such that the conductive material covers the conductive layer, the conductive material and conductive layer defining a plurality of conductive elements electrically connected to one another via one or more busbars; disconnecting the conductive elements from the one or more busbars such that the disconnected conductive elements are electrically isolated from one another.

These and other aspects will be apparent from the following detailed description. In no event, however, should this brief summary be construed to limit the claimable subject matter.

DETAILED DESCRIPTION

Figure 1:
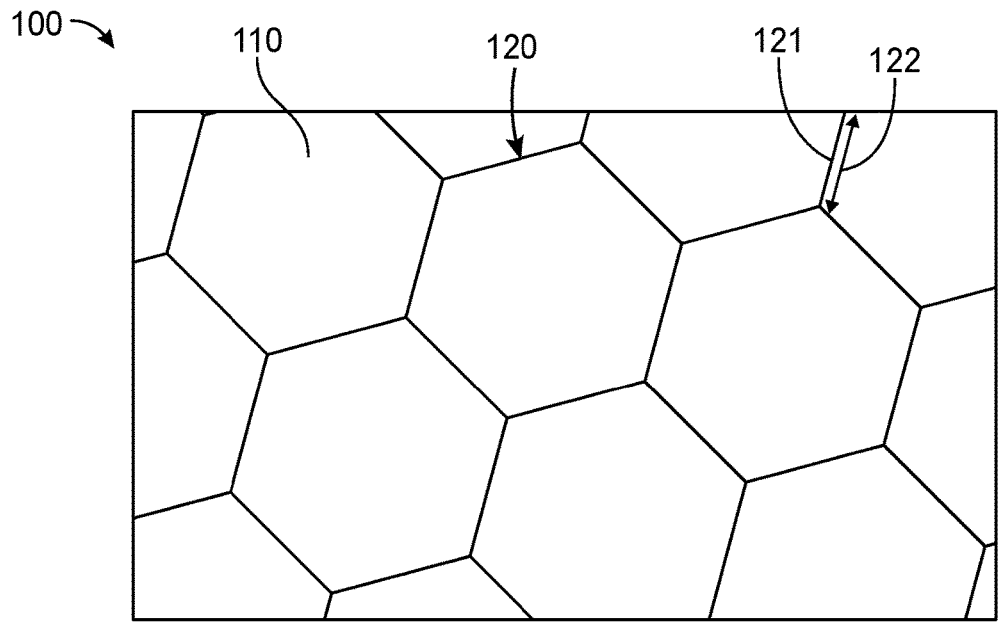
FIG. 1 is a schematic top plan view of a portion of an illustrative patterned article.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

In some embodiments, a patterned article includes electrically conductive elements that are electrically isolated from one another. In other embodiments, a patterned article includes electrically conductive elements electrically connected to one another only by virtue of one or more busbars.

In some embodiments, the busbars are removed or disconnected so that electrically conductive elements are electrically isolated from one another. The electrically conductive elements can be arranged to provide any suitable functionality. For example, in some embodiments, the plurality of electrically conductive elements defines an antenna (see, e.g., FIGS. 12A-12B) which can be or include an antenna array such as a retrodirective antenna array (see, e.g., FIG. 19), for example. Still other examples include an electromagnetic interference (EMI) shield, an electrostatic dissipation component, a heater, an electrode, or a sensor. The devices may be provided as an array of the devices which can be subsequently singulated to provide individual devices.

In some embodiments, the electrically conductive elements are patterned. For example, an electrically conductive element can include or be formed from a micropattern of conductive traces. In some embodiments, at least some (e.g., at least a majority, or in some cases, all) of the electrically conductive elements include a micropattern of conductive traces. Using a micropattern of conductive traces can result in a high optical transparency of the patterned article. In other embodiments, the electrically conductive elements are formed from nonpatterned metal and may have a low optical transparency.

Conductive elements, such as those including a micropatterns of conductive traces, may be formed on a substrate using photolithography processes. According to some aspects of the present description, processes have been developed which allow electrically conductive elements to be formed at least partially within a substrate without utilizing photolithography. In some embodiments, the processes described herein are less expensive and/or more easily implemented than traditional photolithography processes. In some embodiments, the processes allow traces, for example, having a large (e.g., at least 0.8) aspect ratio (thickness divided by width) to be formed. A large aspect ratio may be desired for applications where a high transparency and a high electrical conductance is desired. For example, increasing the open area fraction can increase the transparency but would lower the electrical conductance for a fixed trace thickness. The traces can then be made thicker to increase the electrical conductance, which can lead a high aspect ratio. In some embodiments, the patterned article may be used at relatively high operating frequencies (e.g., the patterned article may be an antenna designed to operate at microwave frequencies) where the skin depth of the material of the traces is smaller than the width of the traces, for example. Using a high aspect ratio increases the surface area of the traces for a given trace width and this increases the conductor usage (and therefore increases the electrical conductance at the operating frequencies) compared to lower aspect ratio traces (e.g., those conventionally formed by lithography or printing) of the same trace width.

In some embodiments, the traces or other conductive elements are formed by plating on a conductive layer (e.g., electroplating on a conductive seed layer) disposed on bottoms of cavities in a substrate. A cavity in a substrate can be a groove in the substrate, a network or micropattern of grooves in the substrate, or other space within the substrate. The sidewalls of the cavities may be free of or substantially free of the conductive seed layer. Plating onto a conductive seed layer disposed on the bottom, but not on the sidewalls, of the cavity has been found to provide improved control over the profile of the trace or other conductive element compared to plating into a cavity where the seed layer is also on the side walls. For example, if the seed layer were on the sidewalls, plating can result in metal being formed on upper portions of the seed layer on the side walls which can result in over deposition of the metal on the top surface of the substrate past the edge of the cavity. Such over deposition can be problematic for patterned articles made by traditional processes, especially when a high aspect ratio is desired since this can lower the optical transmission through the patterned article.

In addition, placing the conductive layer at the bottom of the cavities provides protection (e.g., improved durability) of the conductive layer. For some applications, a high conductance may not be needed, and so no conductive body is plated onto the conductive layer, in some embodiments. In some such embodiments, a nonmetallic material may be disposed in the cavities on the conductive layer. For example, one or more of an adhesive, a polymer, or a dielectric material (e.g., a polymeric optically clear adhesive) may be backfilled into the cavities over the conductive layer.

A conductive member (e.g., body, layer, trace, element, or material) means an electrically conductive member, unless indicated otherwise. A conductive member may have an electrical resistivity less than 1 ohm·m, or less than 0.01 ohm·m, or less than $10^{-4}$ ohm·m, or less than 10' ohm·m, for example. Non-conductive material refers to electrically non-conductive material, unless indicated differently. A non-conductive material may have an electrical resistivity greater than 100 ohm·m, or greater than $10^4$ ohm·m, or greater than $10^6$ ohm·m, or greater than $10^8$ ohm·m, for example. Electrical resistivity refers to the direct current (DC) resistivity, unless indicated differently.

FIG. 1 is a schematic top plan view of a portion of a patterned article 100. The article 100 includes a layer or substrate 110 and an electrically conductive element 120 embedded at least partially in the layer or substrate 110. In the illustrated embodiment, the electrically conductive element 120 includes a pattern (e.g., a micropattern) of conductive traces 121 embedded at least partially in the layer or substrate 110. In other embodiments, the electrically conductive element 120 is not formed from a pattern of traces. Other portions of the patterned article 100 not shown in FIG. 1 may include other electrically conductive elements that are electrically isolated from electrically conductive element 120. Each conductive trace 121 extends along a longitudinal direction 122 of the conductive trace 121. Each conductive trace 121 may have a length along the longitudinal direction 122 and a width along an orthogonal direction where the width is substantially smaller than the length. In some embodiments, the layer or substrate 110 is unitary or includes a unitary layer. For example, the layer or substrate 110 may be a monolithic polymeric layer or substrate or may include a monolithic polymeric first layer disposed on a second layer of the substrate where the conductive element 120 is at least partially embedded in the monolithic polymeric first layer.

In some embodiments, the layer or substrate 110 is substantially transparent. In some embodiments, the patterned article 100 is substantially transparent. For example, the article 100 can be substantially transparent when the article 100 has an open area fraction (portion or percentage of area not covered by a trace in a top plan view of the article 100) that is sufficiently high. In some embodiments, the article 100, or the micropattern of conductive traces 121, has an open area fraction in a range of 80% to 99.95%, or 80% to 99.9%, or 85% to 99.9%, or 90% to 99.9%, or 95% to 99.9%. In some embodiments, in a top plan view, a total area of the pattern of conductive traces 121 is less than 50%, or less than 20%, or less than 10%, or less than 5%, or less than 3%, or less than 2%, or less than 1% of a total surface area of the patterned article 100. In some embodiments, the article 100 an average optical transmittance for normally incident visible light (wavelengths in a range of 400 nm to 700 nm) of at least 50%, or at least 70%, or at least 80%, or at least 90%. In some embodiments, the average optical transmittance may be less than 70% or less than 50%. For example, the article 100 may include additional layer(s) such as a decorative film (e.g., a FASARA window film available from 3M Company, St. Paul, MN) which reduces the average optical transmittance. Other suitable films for the additional layer(s) include 3M DIAMOND GRADE reflective sheeting available from 3M Company, St. Paul, MN and DI-NOC films available from 3M Company, St. Paul, MN, which may reduce or substantially eliminate the optical transmittance of the article but which may benefit from a high optical transmittance of the micropattern of conductive traces 121. The optical transmittance may be measured from a top or a bottom major surface of the article 100. In some embodiments, the average optical transmittance of the substrate with the conductive traces differs from the average optical transmittance of the substrate without the conductive traces by no more than 5%, or no more than 2%, or no more than 1%.

In some embodiments, the article 100 is a flexible film (e.g., bendable 180 degrees around a cylinder having a diameter of 10 cm without cracking). The flexible film may be substantially transparent as described elsewhere.

In some embodiments, the article 100 is at least one of an antenna, an antenna array, a retrodirective antenna array, a Van Atta array, a heater, an electromagnetic interference (EMI) shield, an electrostatic dissipation component, a sensor, filter for electromagnetic waves, architectural film, or an electrode. In some embodiments, the article 100 is or includes an array of any of these elements or devices. In some embodiments, the article 100 is an antenna as described further elsewhere herein. In some embodiments, the article 100 is a sensor such as a touch sensor. In some embodiments, the article 100 is substantially transparent and/or is a flexible film. In some embodiments, the antenna, array of antennas, antenna array, retrodirective antenna array, Van Atta array, heater, electromagnetic interference shield, electrostatic dissipation component, sensor, filter for electromagnetic waves, or electrode, is substantially transparent and/or is a flexible film.

The pattern of conductive traces 121 may be or include a mesh pattern which may be a two-dimensional regular array (e.g., a rectangular, square, triangular, or hexagonal array) or a two-dimensional irregular array of the traces. Suitable micropattern geometries for the article 100 include those described in U.S. Pat. Appl. Publ. Nos. 2008/0095988 (Frey et al.), 2009/0219257 (Frey et al.), 2015/0138151 (Moran et al.), 2013/0264390 (Frey et al.), and 2015/0085460 (Frey), for example.

In some embodiments, each conductive element 120 is disposed at least partially in a cavity in the layer or substrate 110. The cavity can be defined by a plurality of grooves in the layer or substrate. For example, in some embodiments, each trace 121 is disposed at least partially in a groove in the layer or substrate 110.

Figure 2:
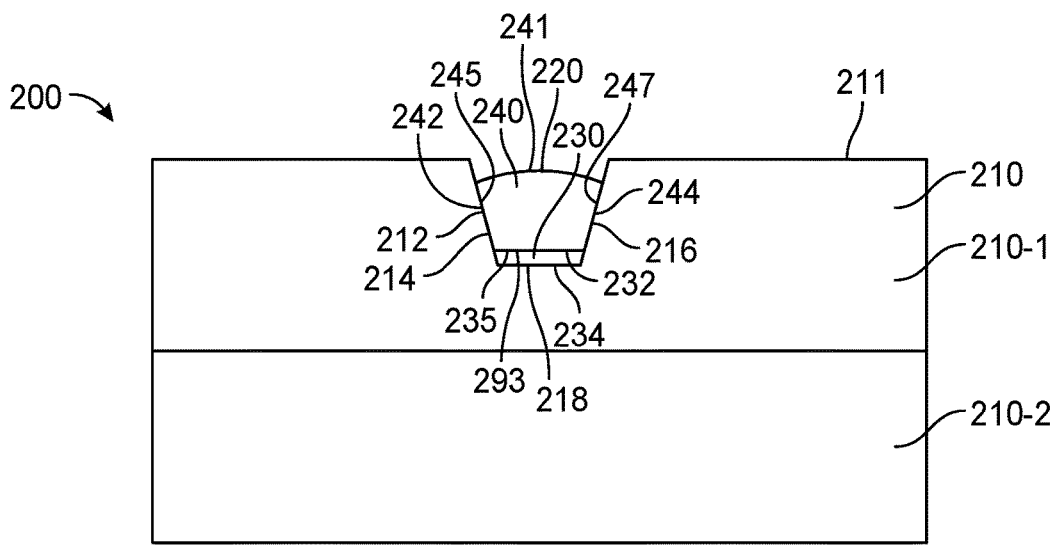
FIGS. 2-3 are schematic cross-sectional views of portions of illustrative patterned articles.

FIG. 2 is a schematic cross-sectional view of a portion of a patterned article 200 including a substrate 210 and a conductive element 220 at least partially embedded in the substrate 210. In the illustrated embodiment, the substrate 210 includes a layer 210-1 disposed on a layer 210-2. In some embodiments, the layer 210-1 is a unitary polymeric layer. In such embodiments, the layer 210-1 may be considered to be a first unitary substrate which is disposed on a second substrate (layer 210-2). In some embodiments, the layer 210-2 is a unitary layer. In some embodiments, layer 210-1 may be formed by casting and curing a resin onto the layer 210-2. In some embodiments, the substrate 210 is substantially transparent and/or polymeric. The conductive element 220 may include a trace in a micropattern of conductive traces, for example. The conductive element 220 includes a conductive seed layer 230 having a top major surface 232 and an opposite bottom major surface 234 in direct contact with the substrate 210 (e.g., in direct contact with a unitary polymeric layer 210-1 of the substrate 210). The conductive element 220 further includes a metallic body 240 disposed on the top major surface 232 of the conductive seed layer 230. The metallic body 240 may be a unitary metallic body and/or can be in direct contact with the conductive seed layer 230. The conductive seed layer 230 may be or include a cured conductive ink or a cured conductive coating, for example, or may be or include a transferred layer (e.g., a transferred metal layer), for example. The metallic body 240 may be formed by plating, for example. The metallic body 240 and the conductive seed layer 230 can be coextensive with one another (e.g., in the x-y plane). In some embodiments, the metallic body 240 and the conductive seed layer 230 differ in at least one of composition or crystal morphology. The metallic body 240 has sidewalls 242 and 244. In some cases, the sidewalls 242 and 244 may be referred to as lateral sidewalls since these are at lateral sides of the metallic body 240 in a top plan view of the patterned article 200. In some embodiments, at least a majority (or at least 60%, or at least 70%, or at least 80%, or at least 90%) of a total area of the sidewalls 242 and 244 is in direct contact with the layer 210-1.

In some embodiments, conductive patterns can be included in layer 210-2 as well as in layer 210-1. Alternatively, a third layer (e.g., another unitary polymeric layer) can be disposed on the layer 210-2 opposite the layer 210-1 and conductive patterns can be formed in the third layer.

The patterned article 200, according to some embodiments, may alternatively or in addition be described as follows. The patterned article 200 includes a substrate 210 including a first cavity or groove 212 therein. For example, the substrate 210 may include a micropattern of grooves therein (see, e.g., FIG. 1) where first cavity or groove 212 is a groove and the micropattern of grooves includes the groove and where the conductive element 220 includes a trace disposed at least partially in the groove. In some embodiments, the first cavity or groove 212 extends along a longitudinal direction (y-direction of the illustrated x-y-z coordinate system) of the first cavity or groove 212 and has a bottom surface 218 and side surfaces 214 and 216. The conductive seed layer 230 is disposed in the first cavity or groove 212 and the metallic body 240 is disposed at least partially in the first cavity or groove 212. In some embodiments, at least one cross-section (e.g., the illustrated cross-section in the x-z plane) of the first cavity or groove 212 perpendicular to the longitudinal direction, the conductive seed layer 230 covers at least a majority (>50% by area) of the bottom surface 218 of the first cavity or groove 212, and the metallic body 240 covers the conductive seed layer 230 and at least a majority (>50% by area) of the side surfaces 214 and 216 of the first cavity or groove 212. In some embodiments, each of the side surfaces 214 and 216 and the metallic body 240 defines a conductor-insulator interface therebetween (245 and 247, respectively), and the metallic body 240 and the conductive seed layer 230 defines a conductor-conductor interface 235 therebetween. In some embodiments, the metallic body 240 is a unitary metallic body.

In some embodiments, the first cavity or groove 212 is generally cuboid shaped and includes four side surfaces and the metallic body 240 has four lateral sidewalls. In some embodiments, the first cavity or groove 212 is a groove with two opposing lateral sidewalls. In some embodiments, the first cavity or groove 212 is generally cylindrically shaped and has a single side surface, and the metallic body has a single lateral sidewall.

As described further elsewhere herein, in some embodiments, the metallic body 240 has a lower first surface roughness at a first interface (245 and/or 247) with the side surfaces (214 and 216) and has a higher second surface roughness at a second interface (235) with the conductive seed layer 230.

As described further elsewhere herein, in some embodiments, in a plane through the metallic body 240 that is parallel to and separate from the conductive seed layer 230, the metallic body has a lower first line edge roughness at a first interface with the side surfaces 214, 216 and the conductive seed layer 230 has a higher second line edge roughness at an edge of the conductive seed layer 230.

In some embodiments, the metallic body 240 may underfill the cavity (e.g., the top surface of the metallic body 240 may be entirely below the top major surface 211). In some embodiments, the metallic body 240 may fill or over fill the cavity or groove 212 (e.g., a portion of the metallic body may extend above the top major surface 211). Whether or not the top surface of the metallic body extends past the top major surface 211, each sidewall preferably extends from the bottom major surface of the metallic body toward or to, but not past, a top major surface of the unitary polymeric layer. An embodiment in which the top surface of the metallic body extends above a top surface of the substrate is schematically illustrated in FIG. 3.

Figure 3:
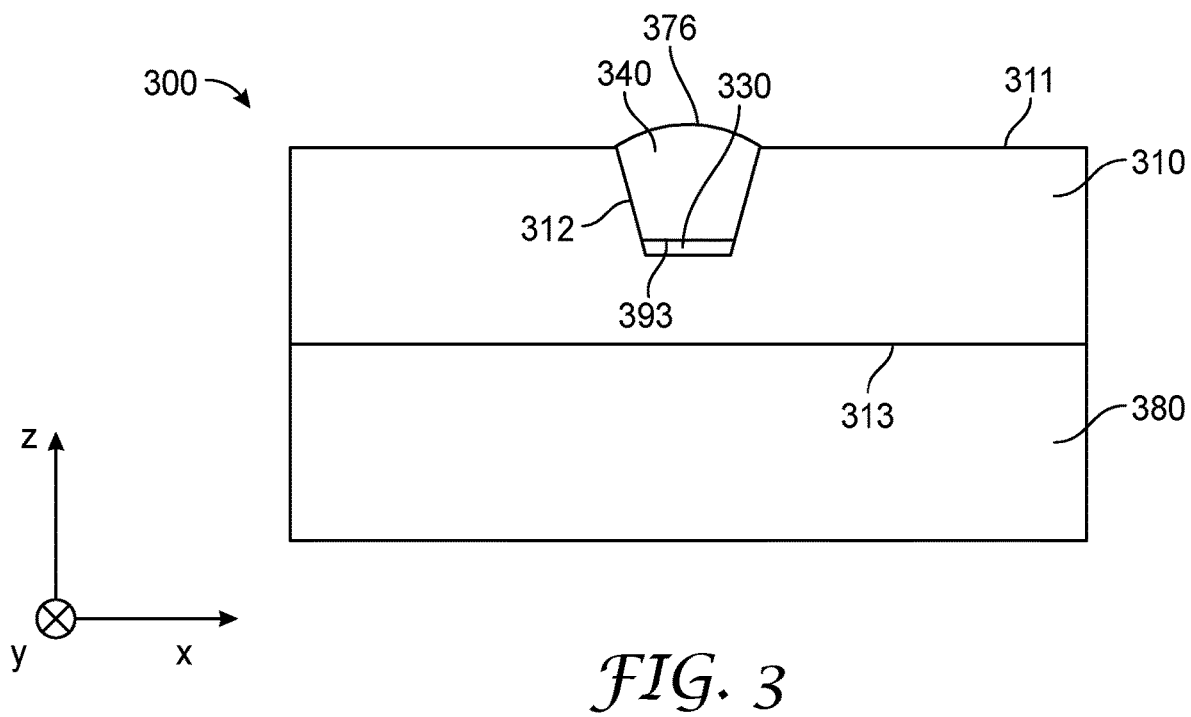

FIG. 3 is a schematic cross-sectional view of a portion of a patterned article 300 including a substrate 310 including a first cavity or groove 312 therein and also including an optional optical film 380 bonded to the substrate 310. A conductive seed layer 330 is disposed in the first cavity or groove 312 and a metallic body 340, which may be a unitary metallic body, is disposed at least partially in the first cavity or groove 312. The substrate 310 may include more than one layer (e.g., corresponding to substrate 210) and may include a unitary top layer, for example. A bottom surface 393 of the metallic body 340 directly contacts a top surface of the conductive seed layer. The patterned article 300 may correspond to the patterned article 200 except that the metallic body 340 extends beyond a top major surface 311 of the substrate 310 in a center portion (in the illustrated cross-section) of the metallic body 340 and the article 300 includes the optional optical film 380. The top surface 376 of the metallic body 340, or of other metallic bodies described herein, may be a convex dome (concave down) as illustrated, on may be concave up, or may be substantially planar, or may have an irregular shape, for example. In some embodiments, the top surface 376 of the metallic body 340 extends at least partially above the top major surface 311 of the substrate 310 (or above the top major surface of a unitary polymeric layer of the substrate 310) as schematically illustrated in FIG. 3. In other embodiments, the top surface 376 of the metallic body 340 is disposed entirely between the top major surface 311 and the bottom major surface 313 of the substrate 310 (or between top and bottom major surfaces of a unitary polymeric layer of the substrate 310).

The optical film 380 may be laminated to the substrate 310 using an optically clear adhesive (not illustrated) or the substrate 310 may be formed directly on the optical film 380. The optical film 380 may be disposed on bottom surface 313 of the substrate 310 as illustrated or may be disposed on the top surface 311 of the substrate 310. In some embodiments, the optical film 380 is or includes one or more of a window film, a textured film, a patterned film, an infrared reflective film, or a retroreflector. Useful optical films include those described in U.S. Pat. Appl. Publ. Nos. 2017/0248741 (Hao et al.), 2015/0285956 (Schmidt et al.), 2010/0316852 (Condo et al.), 2016/0170101 (Kivel et al.), 2014/0204294 (Lv), 2014/0308477 (Derks et al.), 2014/0057058 (Yapel et al.), 2005/0079333 (Wheatley et al.), 2002/0012248 (Campbell et al.), and 2010/0103521 (Smith et al.), for example.

In some embodiments, in the at least one cross-section of the first cavity or groove 312 (resp. 212), the metallic body 340 (resp., 240) fills greater than half of a cross-sectional area of the first cavity or groove 312 (resp., 312). In some embodiments, the metallic body 340 (resp., 240) fills at least 60%, or at least 70%, or at least 80%, or at least 90% of the cross-sectional area of the first cavity or groove 312 (resp., 212). In some embodiments, the metallic body 340 (resp., 240) and the conductive seed layer 330 (resp., 230) together fill the cross-sectional area of the first cavity or groove 312 (resp., 212).

Figure 12A:
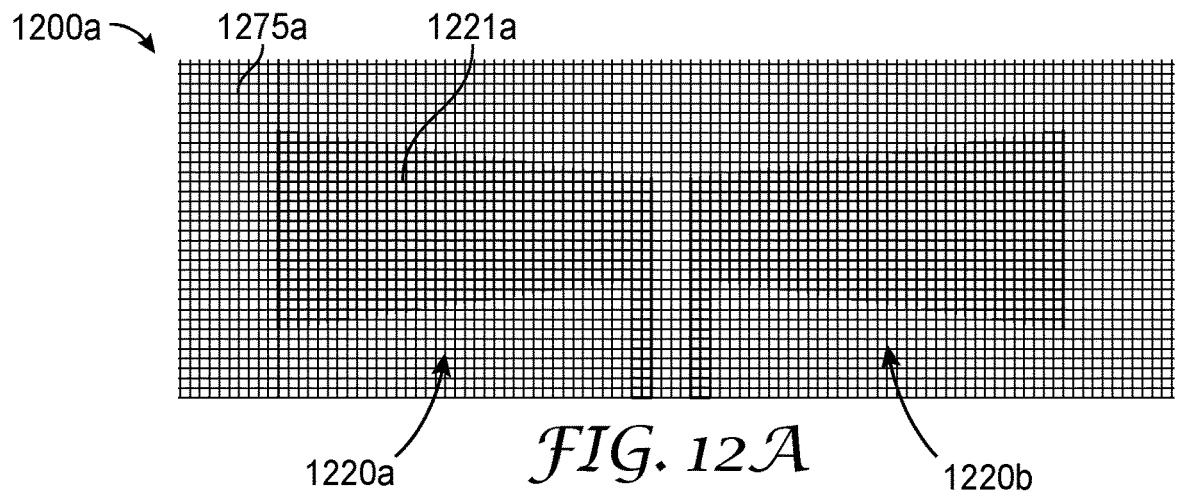
FIGS. 12A-12B are schematic top plan views of illustrative antennas.
Figure 15:
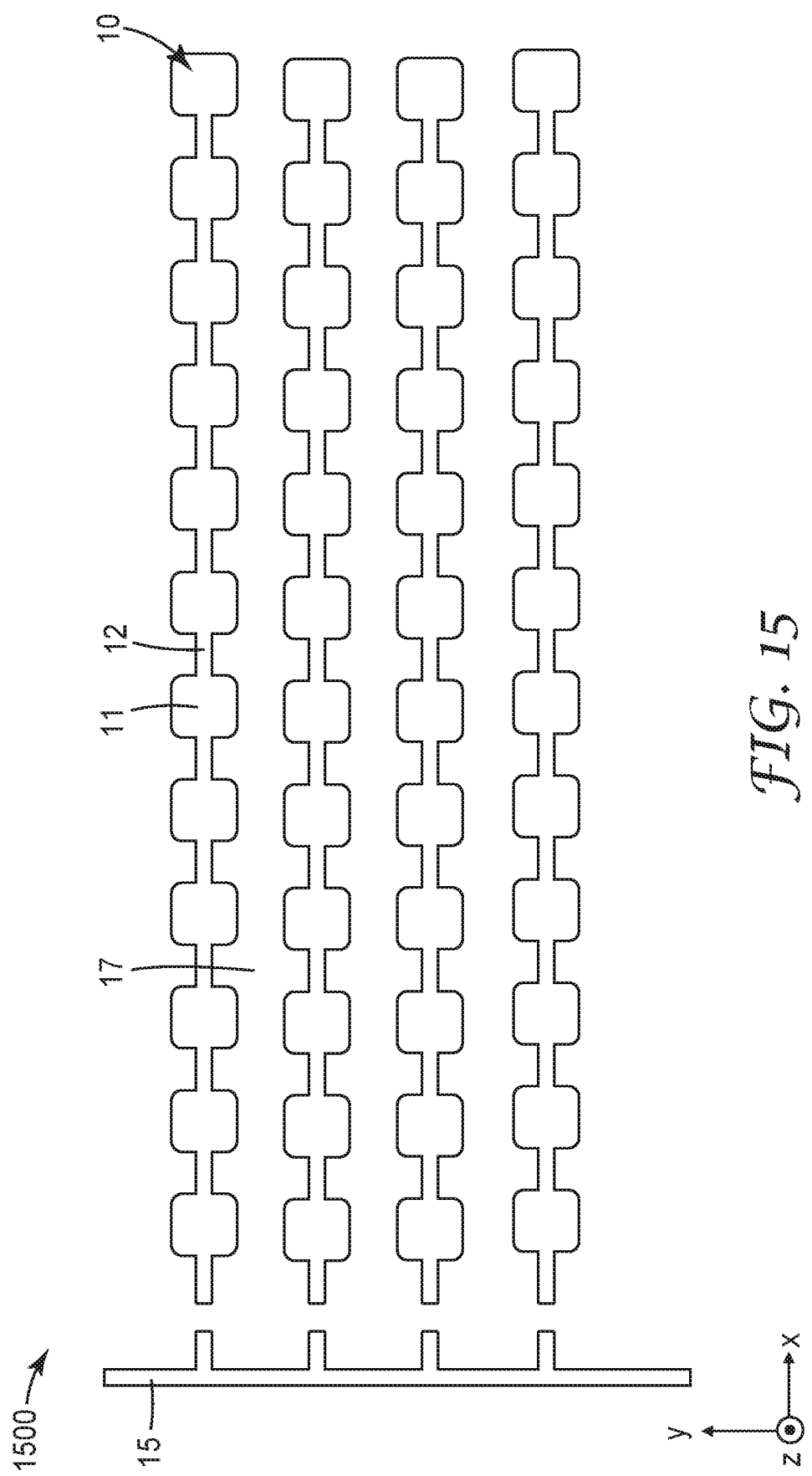
FIGS. 15-19 are schematic top plan views of illustrative patterned articles.
Figure 19:
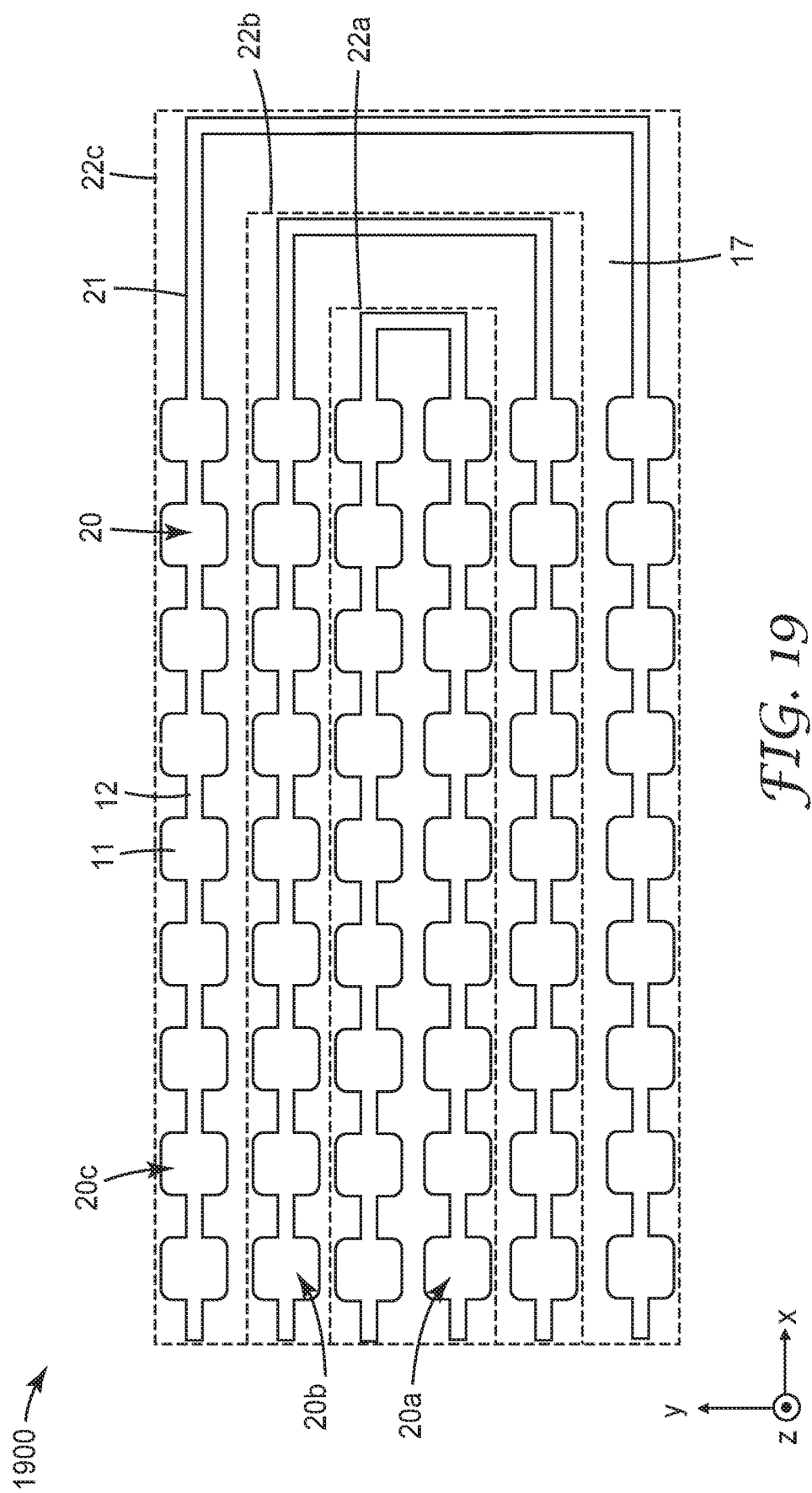

In some embodiments, a patterned article (e.g., 300, 200, 100) includes a unitary polymeric layer (e.g., 310, 210-1, 110) and a plurality of electrically conductive elements (e.g., 320, 220, 120) embedded at least partially in the unitary polymeric layer and being electrically isolated from one another. In the portions of the articles shown in FIGS. 1-3, only one electrically conductive element is shown; a plurality of electrically isolated electrically conductive elements is schematically illustrated in FIGS. 12A, 15 and 19, for example. Each electrically conductive element includes a conductive seed layer (e.g., 330, 230) having a top major surface (e.g., 235) and an opposite bottom major surface (e.g., 234) in direct contact with the unitary polymeric layer (e.g., 310, 210-1); and a metallic body (e.g., 340, 240) disposed on the top major surface of the conductive seed layer. The metallic body has a bottom major surface (e.g., 393, 293) and at least one sidewall (e.g., 242, 244). The bottom major surface (e.g., 393, 293) contacts the conductive seed layer. Each sidewall is in direct contact with the unitary polymeric layer and extends from the bottom major surface (e.g., 393, 293) of the metallic body toward or to, but not past, a top major surface (e.g., 311, 211) of the unitary polymeric layer. In some embodiments, each sidewall extends toward, but not to, the top major surface of the unitary polymeric layer.

Figure 4:
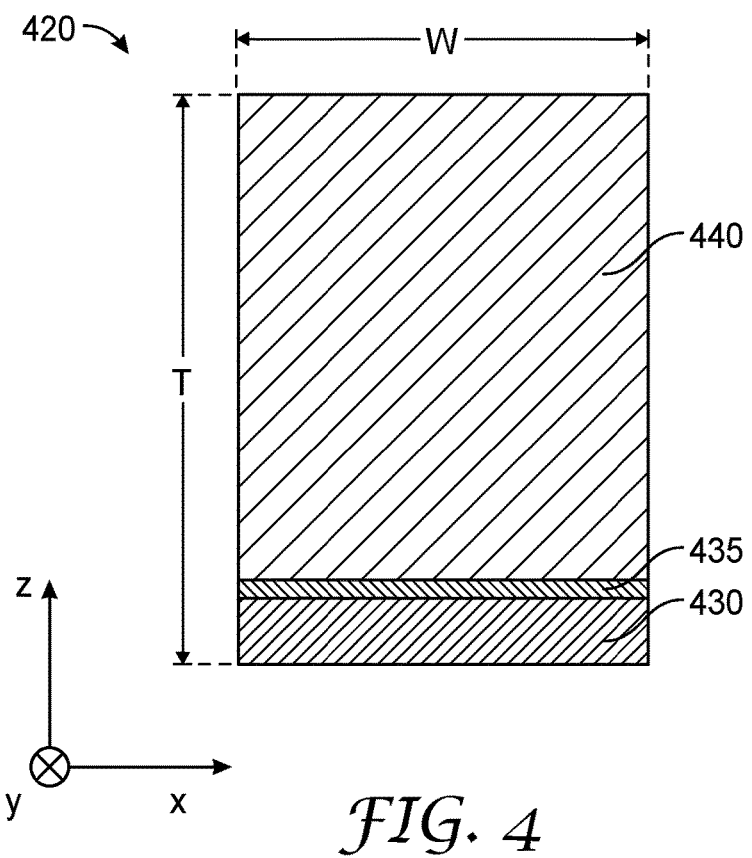
FIG. 4 is a schematic cross-sectional view of an illustrative conductive element.

FIG. 4 is a schematic cross-sectional view of a conductive element 420 including a metallic body 440 disposed on a conductive seed layer 430. The conductive element 420 may have substantially vertical sidewall(s) as schematically illustrated in FIG. 4 or the sidewall(s) may be sloped as shown elsewhere herein. In some embodiments, the metallic body 440 and the conductive seed layer 430 differ in at least one of composition or crystal morphology. The compositions can be different when the conductive seed layer 430 and the metallic body 440 include different metals, or when the conductive seed layer 430 is a cured conductive ink or a cured conductive coating, while the metallic body 440 is a solid metal, for example. The different cross hatching in FIG. 4 may schematically represent different compositions, for example. Alternatively, or in addition, the different cross hatching in FIG. 4 may schematically represent different crystal morphologies, for example. The crystal morphologies can be different when the conductive seed layer 430 and the metallic body 440 are formed from a same metal but the metals have differing grain size distributions due to differing process conditions in forming the materials, for example. As another example, the composition and crystal morphology can be different when the conductive seed layer 430 is formed from a first metal having a first crystal structure (e.g., one of face centered cubic (fcc), body centered cubic (bcc), or hexagonal close packed (hcp)) and the metallic body 440 is formed from a different second metal having a different second crystal structure (e.g., a different one of fcc, bcc, or hcp). As still another example, the crystal morphology can be different when one of the metallic body 440 and the conductive seed layer 430 is amorphous or substantially amorphous and the other of the metallic body 440 and the conductive seed layer 430 has a substantial crystallinity. In some embodiments, the metallic body 440 and the conductive seed layer 430 have different crystal morphologies that can be characterized in terms of different average grain sizes. The average grain size can be determined as described in ASTM standard E 112-13 "Standard Test Methods for Determining Average Grain Size", for example.

The metallic body 440 and the conductive seed layer 430 define an interface 435 therebetween. The interface 435 can be sharp (e.g., when the metallic body 440 and the conductive seed layer 430 have different compositions and there is little diffusion between the two layers) or broadened (e.g., when the metallic body 440 and the conductive seed layer 430 have the same compositions but different crystal morphologies and there is a transition region between the different crystal morphologies, or when there is substantial diffusion between the two layers that broaden the interface 435). The interface 435 generally has a thickness (dimension along the z-direction) substantially less than a thickness of the metallic body 440. In some embodiments, the interface 435 has a thickness of less than 5 percent, or less than 2 percent, or less than 1 percent, or less than 0.5 percent of a thickness of the metallic body 440. In some embodiments, the interface 435 is a conductor-conductor interface having a thickness of less than 1 micrometer, or less than 500 nm, or less than 300 nm, or less than 100 nm, or less than 50 nm.

In some embodiments, each of the conductive elements in at least a majority of the conductive elements includes, or is defined by, a micropattern of conductive traces. In some embodiments, each conductive trace in at least a majority of the conductive traces in the micropattern has a width W along a width direction (x-direction) orthogonal to the longitudinal direction (y-direction) and to a thickness direction (z-direction) of the substrate, and has a thickness T along the thickness direction. In cases where the trace tapers, the width W can be understood to be the width of the trace at a vertical position where the trace is widest (e.g., proximate the top of the trace). In some embodiments, T/W is at least 0.8, 1, 1.2, 1.5, 2, 5, or 7. In some such embodiments, the patterned article has an optical transmittance and/or open area fraction in any of the ranges described elsewhere herein.

Figure 5A:
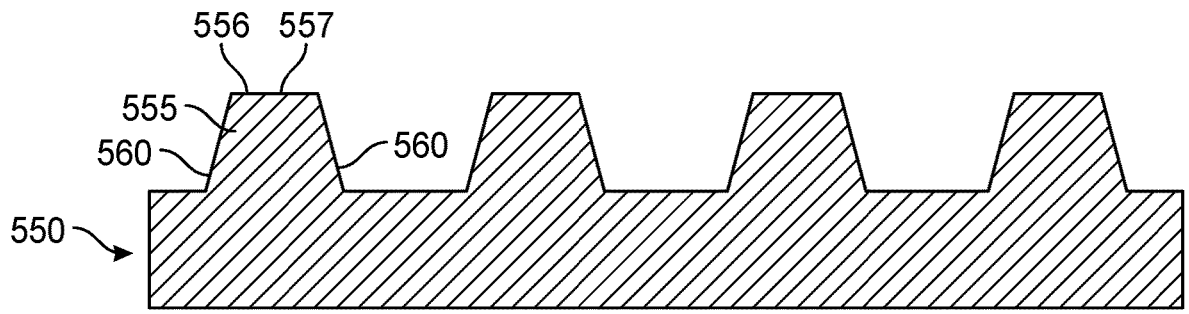
FIGS. 5A-5H are schematic illustrations of steps in exemplary processes for making a patterned article.
Figure 5B:
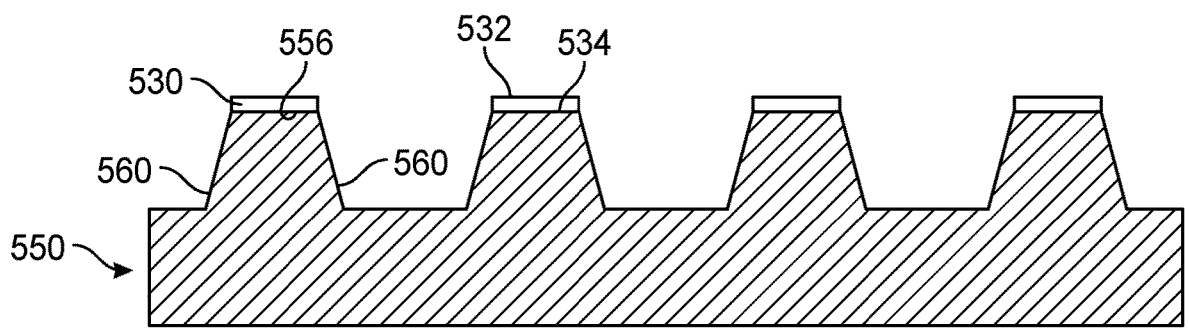

FIGS. 5A-5H schematically illustrate various steps in illustrative processes for making a patterned article. In some embodiments, the process includes providing a tool 550 having at least one raised portion 555 (e.g., at least one ridge) as schematically illustrated in FIG. 5A which is a schematic cross-sectional view of the tool 550. The tool 550 is schematically shown as having a substantially planar bottom surface in the illustrated embodiment. In other embodiments, the tool 550 has a generally cylindrical shape, for example. The tool 550 can be made via diamond turning, laser machining, or photolithography, for example. The tool may be a metal tool or may be a polymer tool formed from a metal tool (e.g., by compression molding the polymer against the metal tool), for example. The process includes disposing a conductive layer 530 on a top surface 556 of a first portion 557 of the at least one raised portion 555 such that at least a majority of a total area of side surfaces 560 of the first portion 557 of the at least one raised portion 555 is free of the conductive layer 530 as schematically illustrated in FIG. 5B. The top surface 556 may be substantially planar as schematically illustrated in FIG. 5A or may be structured or shaped to provide a desired structure or shape to the resulting conductive layer 530. The conductive layer 530 has a major surface 534 in contact with the tool 550 and an opposite major surface 532. In some embodiments, at least a majority of a total area of side surfaces of the at least one raised portion 555 is free of the conductive layer 530. After the conductive layer 530 is disposed on the top surface 556, the conductive material of the conductive layer 530 covers less than half, and preferably less than 25% or less than 10%, of the total area of side surfaces 560. In some embodiments, the first portion 557 may include all of the at least one raised portion 555 and the top surface 556 may be the top surface(s) of all of the raised portion(s) in the at least one raised portion 555. In other embodiments, the portion (e.g., first portion 557b depicted in FIG. 5C) of the at least one raised portion 555 which receives a conductive layer may include less than all of the at least one raised portion 555.

Figure 5C:
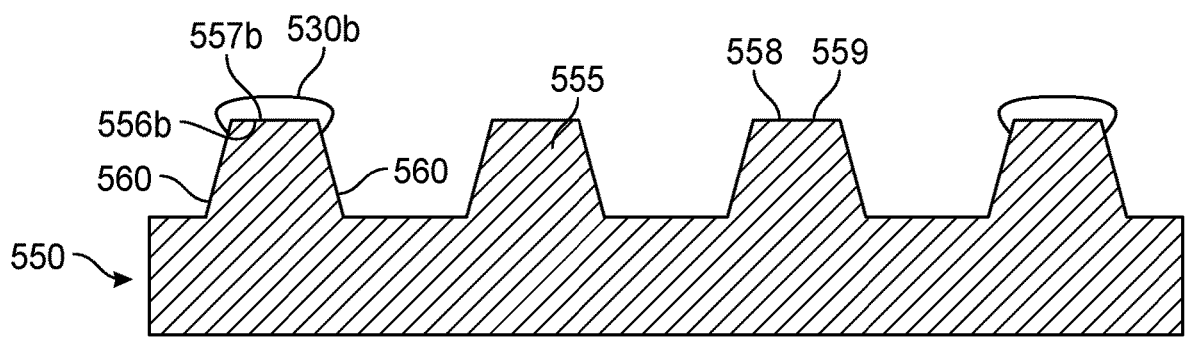

In some embodiments, after disposing the conductive layer 530 on a top surface 556b of a first portion 557b (see FIG. 5C) of the at least one raised portion 555, a top surface 558 of a second portion 559 of the at least one raised portion 555 is free of the conductive layer 530. This is schematically illustrated in FIG. 5C which schematically illustrates conductive layer 530b disposed on the top surface on only two of the illustrated four raised portions. Providing a conductive layer on only a portion of the top surfaces of the raised portions allows a tool having a uniform pattern (e.g., a uniform hexagonal pattern) to produce a conductor micropattern, for example, that has a non-uniform pattern (e.g., the conductor may be in a hexagonal pattern in some regions and may be absent from other regions). In some embodiments, the first portion 557b of the at least one raised portion 555 includes a plurality of first raised portions and the second portion 559 of the at least one raised portion 555 includes a plurality of second raised portions.

Figure 5D:
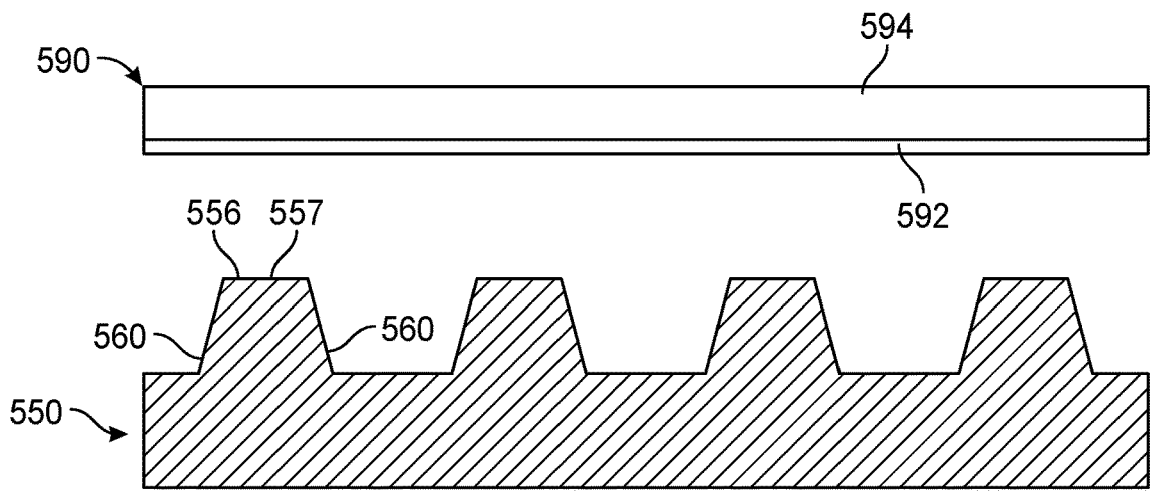
Figure 5E:
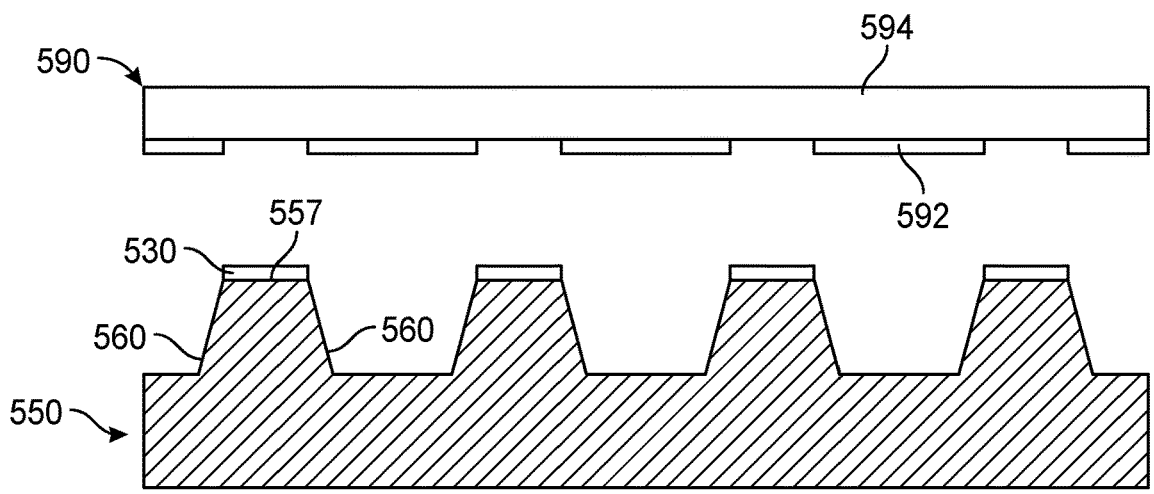

In some embodiments, the conductive layer 530 or 530b is provided as a transfer layer. In some embodiments, disposing the conductive layer 530 (or 530b) on the top surface 556 (or 556b) of the first portion 557 (or 557b) of the at least one raised portion 555 includes transferring the conductive layer from a transfer film to the top surface. This is schematically illustrated in FIGS. 5D-5E which are schematic cross-sectional views before and after the conductive layer 530 is transferred to the top surface 556. The transfer film 590 includes a transfer layer 592 disposed on a substrate 594. When the transfer film 590 is contacted with the tool 550, portions of the transfer layer 592 are transferred from the substrate 594 to the top surface 556 to form the conductive layer 530. The transfer layer 592 may include sublayers. For example, the transfer layer 592 may include a metallic layer (or other conductive layer) and an adhesive layer for releasably attaching the metallic layer to the top surface 556. The metallic layer (or other conductive layer) may be a unitary conductive layer. The transfer layer 592 may further include a crosslinked polymer layer (e.g., an acrylic layer) where the metallic or other conductive layer is disposed on either side of the crosslinked polymer layer. The transfer layer 592 may further include a dielectric layer which may be disposed between the metallic or other conductive layer and the crosslinked polymer layer. In some embodiments, the transfer layer 592 includes a dielectric layer that after being transferred to the tool 550 is between the transferred conductive layer and the top surface 556. In such embodiments, a polymeric layer 510 (see FIG. 5G) formed using the tool with the transferred conductive layer may include the dielectric layer at the bottom of at least one cavity or groove 512 in the polymeric layer 510 and the process may include removing (e.g., via reactive ion etching) this dielectric layer. The transfer layer may be prepared as described in U.S. Pat. No. 8,658,248 (Anderson et al.) or U.S. Pat. No. 7,018,713 (Padiyath et al.), for example. The substrate 594 may include a release layer disposed on a polymer substrate layer. The transfer film may be as described in U.S. Pat. Appl. Pub. No. 2020/0016879 (Gotrik et al.) or International Pat. Appl. No. WO 2018/178803 (Gotrik et al.), for example.

In some embodiments, the conductive layer 530 or 530b is applied as a conductive ink or as a conductive coating. In some embodiments, disposing the conductive layer 530b (or 530) on the top surface 556b (or 556) of the first portion 557b (or 557) of the at least one raised portion 555 includes inking the tool 550 with conductive ink, or coating the tool with a conductive coating, such that the conductive ink or coating is disposed on the top surface. In some such embodiments, the conductive ink or coating is cured (e.g., by drying and sintering or by other means of curing such as those described elsewhere herein for curing the resin layer) and the cured conductive ink or coating is the conductive layer 530b (or 530). The curing the conductive ink or coating step may be carried out prior to a step of solidifying a polymer or polymer precursor step (described below), after the solidifying step, or simultaneously with the solidifying. Applying the conductive layer as a conductive ink or coating may result in some wetting of the side surface 560 as schematically illustrated in FIG. 5C.

Figure 5F:
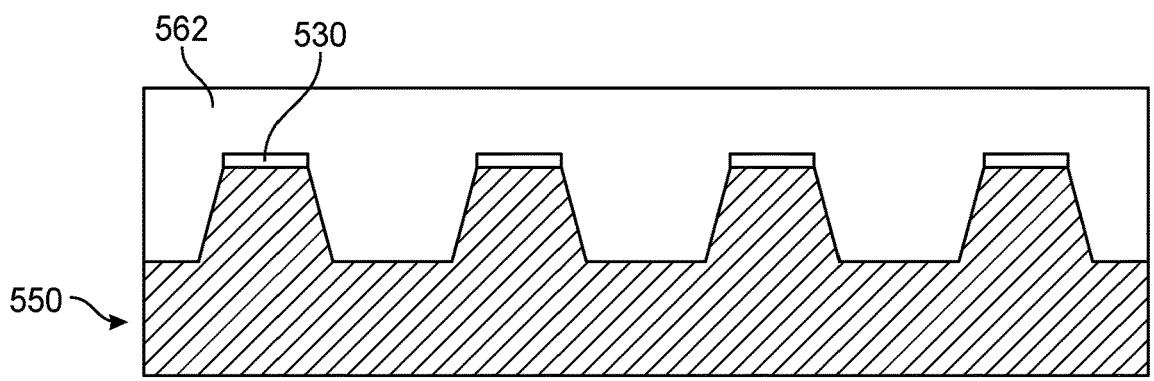
Figure 5G:
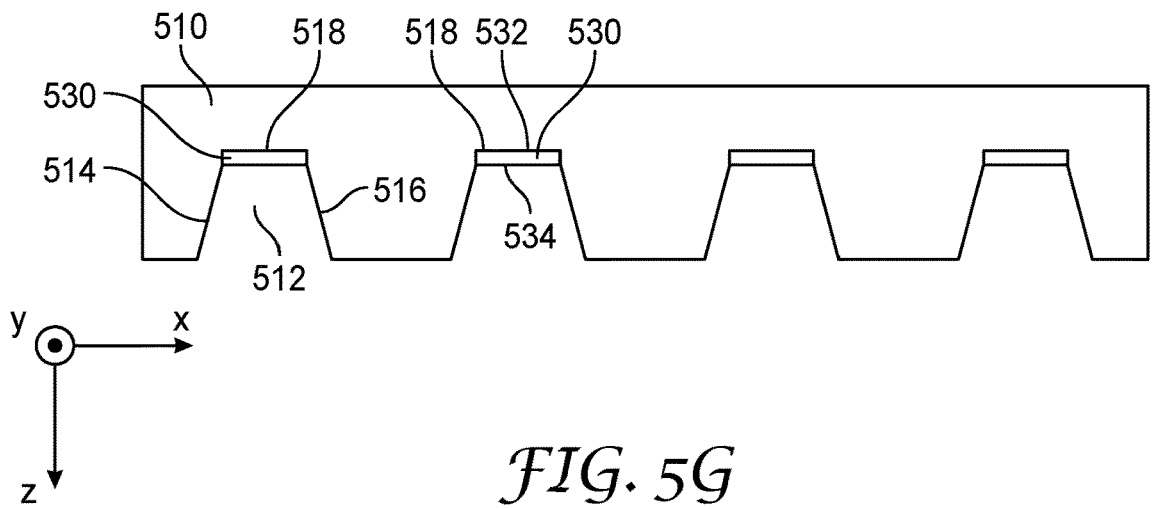
Figure 5H:
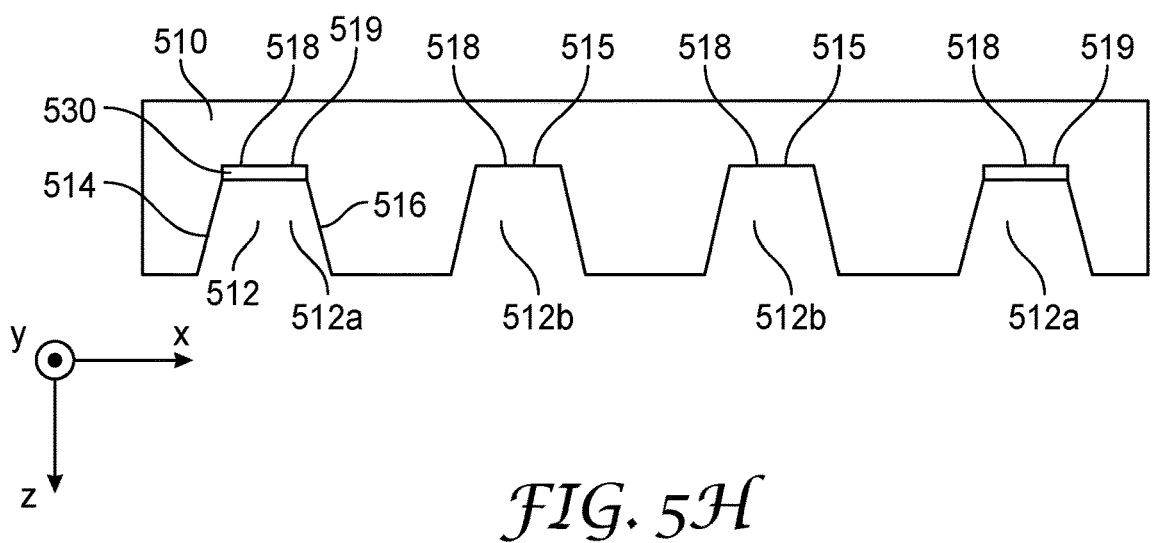

The process includes disposing (e.g., casting) a polymer or polymer precursor 562 onto the tool 550 after the disposing the conductive layer step; solidifying the polymer or polymer precursor to form a polymeric layer 510 including at least one cavity 512 corresponding to the at least one raised portion 555; removing the polymeric layer 510 and the conductive layer 530 from the tool 550 such that the conductive layer 530 is disposed at a bottom surface 518 of the at least one cavity 512. FIG. 5F is a schematic cross-sectional view of the tool 550 including the polymer or polymer precursor 562 disposed on the tool 550. FIG. 5G is a schematic cross-sectional view of the polymeric layer 510 with the conductive layer 530 disposed at the bottom surface 518 of the at least one cavity 512. A major surface 532 of the conductive layer 530 contacts the bottom surface 518 of the at least one cavity 512. The conductive layer 530 may cover all or substantially all of a total surface area of the bottom surface 518 of the least one cavity 512 or may cover a first portion 519 (e.g., corresponding to first portion 557b) of the bottom surface 518 while a second portion 515 of the bottom surface 518 is free of the conductive layer 530 as schematically illustrated in FIG. 5H. The at least one cavity 512 may be a plurality of cavities or may be a single cavity (e.g., an interconnected network of cavities may alternatively be considered to be a single cavity).

Spatially related terms, including but not limited to, "bottom", "lower", "upper", "beneath", "below", "above," "top", and "on top," if used herein, are utilized for ease of description to describe spatial relationships. Such spatially related terms encompass different orientations of the article in use or operation in addition to the particular orientations depicted in the figures and described herein. For example, a bottom surface of a groove or cavity is opposite an open top of the groove or cavity regardless of whether a substrate including the groove or cavity is turned over or flipped over.

The at least one cavity 512 may be described as corresponding to the at least one raised portion 555 when each cavity in the at least one cavity is formed from a raised portion in the at least one raised portion 555. For example, the at least one cavity 512 may be or include a groove and the at least one raised portion 555 may be or include a ridge that formed the groove. The correspondence may be or not be one to one. For example, in some embodiments, the tool is generally cylindrical and is used in a continuous roll-to-roll processes, and the same raised portion may form a plurality of cavities in the at least one cavity 512 (e.g., if the tool has a circumference of 20 cm, the same raised portion in the tool may be used to make a plurality of cavities in the polymer layer that are spaced apart from one another by 20 cm). In some cases, the tool may include additional raised portions not coated by the resin and there may be no cavity that corresponds to the uncoated raised portion(s) (e.g., if no polymer or polymer precursor is cast onto an end portion of the tool, any raised portion that may be present in the end portion would not produce a cavity in the resulting polymer layer).

In some embodiments, the polymer or polymer precursor is or includes a molten polymer and solidifying the polymer or polymer precursor includes cooling the molten polymer. For example, the polymer or polymer precursor may be a thermoplastic resin (e.g., polyethylene terephthalate, polypropylene, polycarbonate, or other thermoplastic resins known in the art) applied as a melt that is cooled to form a thermoplastic polymer layer. In some embodiments, the polymer or polymer precursor is or includes a thermally softened polymer, and solidifying the polymer or polymer precursor comprises cooling the thermally softened polymer. For example, the polymer may be softened by applying heat, embossed or otherwise structured, and then cooled to harden the polymer. In some embodiments, the polymer or polymer precursor is or includes the polymer precursor and solidifying the polymer or polymer precursor includes polymerizing the polymer precursor. In some embodiments, the polymer or polymer precursor is or includes a resin and solidifying the polymer or polymer precursor includes curing the resin. Curing the resin can include applying actinic radiation to the resin, heating the resin, and/or catalyst curing. For example, the resin may be cured by applying radiation (e.g., ultraviolet (UV) radiation, or electron-beam radiation, or other actinic radiation), or by applying heat, or by using other cross-linking mechanisms known in the art. The resin may be an acrylate or an epoxy, for example, or other resin chemistries may be used.

In some embodiments, the process further includes depositing conductive material (e.g., via electroplating) into the at least one cavity 512 such that the conductive material covers the conductive layer 530. This may be done after removing the polymeric layer 510 and the conductive layer 530 from the tool 550 as schematically illustrated in FIGS. 5G-5H. The conductive material may form a metallic body as described elsewhere herein. In some embodiments, depositing conductive material into the at least one cavity 512 includes depositing conductive material into a first portion 512a of the at least one cavity (e.g., the portion of the at least one cavity 512 including the conductive layer 530) corresponding to the first portion of the least one raised portion and not into a second portion 512b of the at least one cavity (e.g., the portion of the at least one cavity 512 not including the conductive layer 530) corresponding to the second portion of the at least one raised portion.

In some embodiments, as described further elsewhere herein, depositing conductive material into the at least one cavity 512 such that the conductive material covers the conductive layer 530 results in the conductive material and conductive layer 530 defining a plurality of conductive elements electrically connected to one another via one or more busbars (e.g., electrically conductive line(s) or bar(s) or other element(s) that may be used to electrically connect the electrically conductive elements to keep the electrically conductive elements at substantially a same electrical potential, for example). In some embodiments, the process further includes disconnecting the conductive elements from the one or more busbars such that the disconnected conductive elements are electrically isolated from one another. The conductive material can be metal (e.g., electroplated metal), for example. Each conductive element can include a metallic body (formed by the conductive material) disposed on a conductive seed layer as described further elsewhere herein. The metallic body and the conductive seed layer can be coextensive with one another.

In some embodiments, the articles schematically depicted FIGS. 5G-5H may be described as including a substrate (e.g., polymeric layer 510, or a polymeric layer 510 plus a substrate layer on which polymeric layer 510 may be formed) including a first cavity therein (e.g., any of cavities 512 depicted in FIG. 5G or any of cavities in the first portion 512a depicted in FIG. 5H) where the first cavity extends along a longitudinal direction (y-direction) and has a bottom surface 518 and side surfaces 514 and 516 (e.g., the first cavity can be a groove and the side surfaces 514 and 516 can be opposing lateral side surfaces of the groove); and a unitary conductive layer (e.g., conductive layer 530 or a unitary sublayer (e.g., a transferred metallic layer) of conductive layer 530) disposed in the first cavity. In at least one cross-section of the first cavity perpendicular to the longitudinal direction, the conductive layer covers at least a majority of the bottom surface of the first cavity, and at least a majority of the side surfaces of the first cavity does not contact material having a same composition as that of the unitary conductive layer. For example, in some embodiments, the side surfaces 514 and 516 may contact air. In some embodiments, a dielectric material, or a conductive material having a different composition from that of the unitary conductive layer, or a nonmetallic material is disposed at least partially in the first cavity and in the at least one cross-section of the first cavity where this material covers at least a majority of the side surfaces of the first cavity (see, e.g., FIG. 14).

Figure 6:
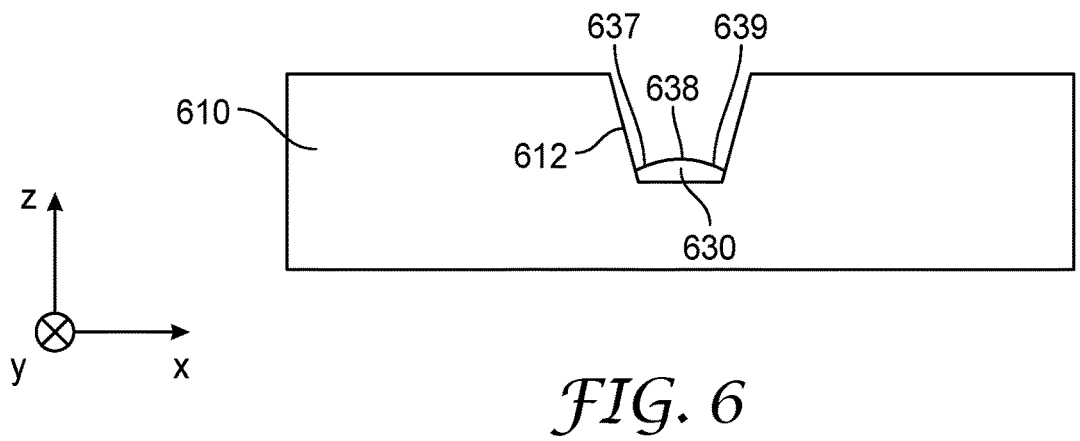
FIG. 6-7 are schematic cross-sectional views of substrates that include a groove or cavity with a conductive seed layer disposed on a bottom surface of the groove or cavity according to some embodiments.

FIG. 6 is a schematic cross-sectional view of a layer 610 (which may be a unitary layer of a multilayer substrate and/or which may be a unitary polymeric layer, for example) including a groove or cavity 612 with a conductive seed layer 630 disposed on a bottom surface of the groove or cavity 612. The bottom major surface of the conductive seed layer 630 may be in direct contact with the layer 610. A metallic body may be formed (e.g., by plating) on the conductive seed layer 630 to form a conductive element, which can include a conductive trace extending along a length (y-direction) of the trace, for example. In some embodiments, the conductive seed layer 630 has a central region 638 extending along a length of the conductive trace and being disposed between first and second edge regions 637 and 639 extending along a length of the central region 638. In some embodiments, the central region 638 has an average thickness (unweighted mean of the thickness) greater than an average thickness of each of the first and second edge regions 637 and 639.

Figure 7:
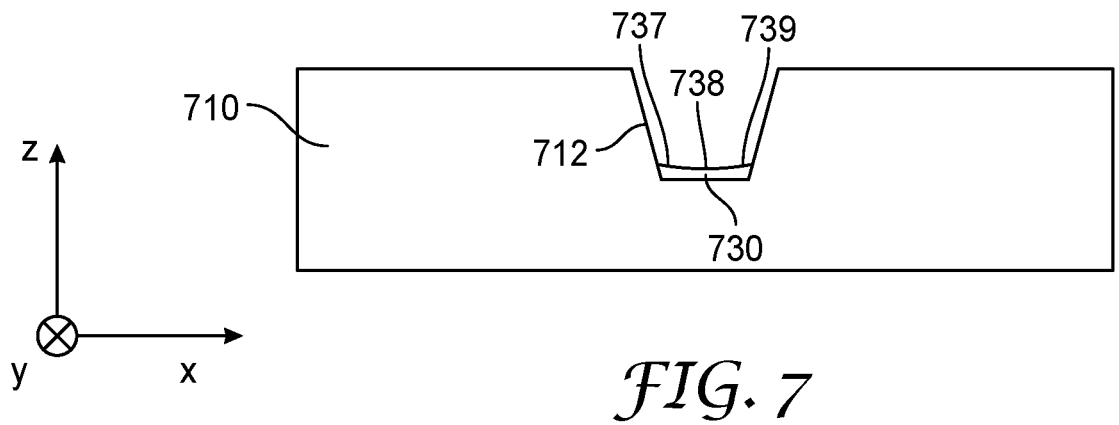

FIG. 7 is a schematic cross-sectional view of a layer 710 (e.g., a unitary layer of a substrate) including a groove or cavity 712 with a conductive seed layer 730 disposed on a bottom surface of the groove or cavity 712. The layer 710 may correspond to layer 610 and the conductive seed layer 730 may correspond to the conductive seed layer 630 except for the thicknesses of the central region 738 and the edge regions 737 and 739. A metallic body may be formed (e.g., by plating) on the conductive seed layer 730 to form a conductive element, which can include a trace extending along a length (y-direction) of the trace, for example. In some embodiments, the conductive seed layer 730 has a central region 738 extending along the length of the conductive trace and being disposed between first and second edge regions 737 and 739 extending along a length of the central region 738. In some embodiments, the central region 738 has an average thickness less than an average thickness of each of the first and second edge regions 737 and 739.

In some embodiments, top surfaces of the raised portions (e.g., ridges) of a tool used in forming conductive seed layers are substantially flat and the relative thickness of the central and edge regions depend on one or more of the surface energy of the material deposited to form the conductive seed layer, the surface energy of the material of the tool, and the surface energy of the material of the substrate. In other embodiments, top surfaces of the raised portions may be shaped to determine the relative thickness of the central and edge regions. In some embodiments, the thicknesses of the central and edge regions are about the same (e.g., differ by less than 10%, or less than 5%).

Figure 8:
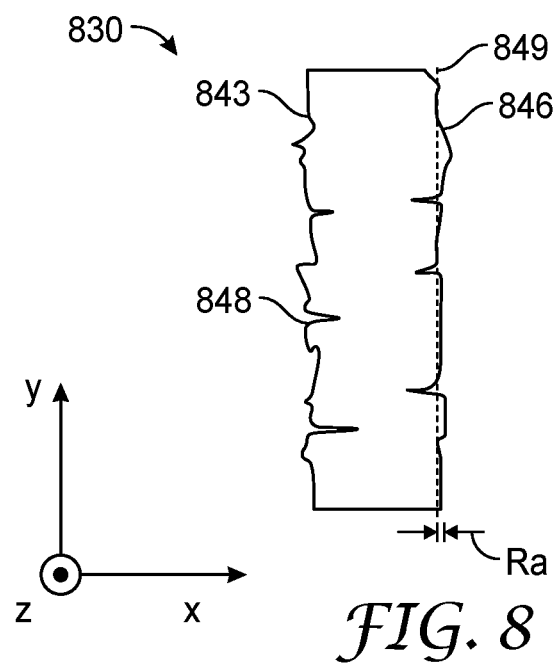
FIG. 8 is a schematic top view of an illustrative conductive seed layer.

In some embodiments, a conductive seed layer includes irregular edges or fractured edges. In some embodiments a conductive seed layer includes a plurality of fractures. For example, in some embodiments, the conductive seed layer is a transferred layer and the transfer process results in fractures. The fractures may extend from an edge to an interior region of the conductive seed layer, for example. FIG. 8 is a schematic top view of a conductive seed layer 830 which includes side edges 843 and 846. In some embodiments, the roughness of the edges 843 and 846 may characterized in terms of a line edge roughness. The roughness parameter Ra may be used for the line edge roughness. For example, the edge 846 has a line edge roughness Ra which can be described as the mean of an absolute value of displacement of the edge 846 from the mean location 849 of the edge. The line edge roughness Ra may be in any of the ranges described elsewhere herein. In the illustrated embodiment, the conductive seed layer 830 includes a plurality of fractures 848 and the edges 843 and 846 are fractured edges.

Figure 9:
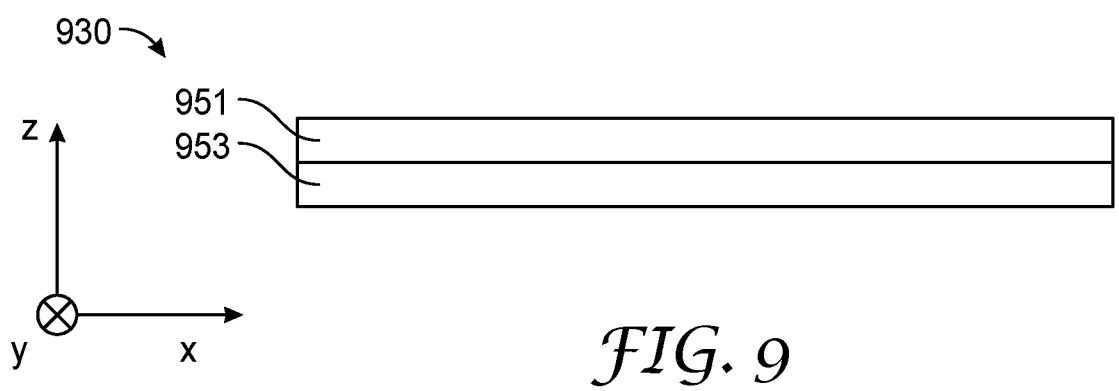
FIGS. 9-10 are schematic cross-sectional views of illustrative conductive seed layers.
Figure 10:

A conductive seed layer may be a single unitary layer or may include a plurality of sublayers. For example, the conductive seed layer may include an electrically conductive sublayer disposed on a non-conductive sublayer which may be at least one of a tie layer or a crosslinked polymer layer. FIG. 9 is a schematic cross-sectional view of a conductive seed layer 930 that includes a conductive layer 951 disposed on a crosslinked polymer layer 953. The conductive layer 951 may be a sputtered or vapor deposited metal layer, for example. The crosslinked polymer layer 953 may be a crosslinked acrylic layer, for example. In some embodiments, the conductive seed layer 930 further includes a dielectric layer (e.g., an oxide layer) disposed between the conductive layer 951 and the crosslinked polymer layer 953. FIG. 10 is a schematic cross-sectional view of a conductive seed layer 1030 that includes a conductive layer 1051 disposed (indirectly) on a crosslinked polymer layer 1053 with a dielectric layer 1052 disposed between the conductive layer 1051 and the crosslinked polymer layer 1053. In some embodiments, the dielectric layer 1052 is or includes an oxide layer (e.g., a silicon aluminum oxide layer). In some embodiments, the thickness of crosslinked polymer layer 953 or 1053 is less than 500 nm, or 300 nm, or 100 nm. In some embodiments, the conductive layer 951 or 1051 is or includes a metallic layer having a thickness of less than 500 nm, or 300 nm, or 100 nm. The conductive layer 951 and/or the conductive layer 1051 may be a unitary conductive layer.

Figure 11A:
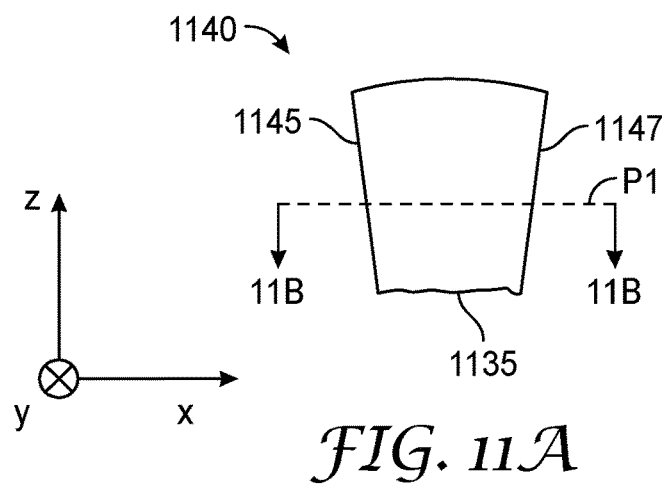
FIGS. 11A-11B are schematic cross-sectional views of an illustrative metallic body in orthogonal cross-sections.

FIG. 11A is a schematic cross-sectional view of a metallic body 1140. The metallic body 1140 may be disposed at least partially in a groove in a substrate (not illustrated in FIG. 11A) where the groove has a bottom surface and side surfaces. The metallic body 1140 has an interface 1145 with a side surface, an interface 1147 with a side surface, and an interface 1135 with a conductive seed layer disposed on the bottom surface of the groove. In some embodiments, the metallic body 1140 may have a lower first surface roughness at a first interface (1145 and/or 1147) with the side surfaces and a higher second surface roughness at a second interface (1135) with the conductive seed layer. For example, in some embodiments, the substrate includes a unitary polymeric layer and the metallic body 1140 forms a relatively smooth interface with the unitary polymeric layer, while the seed layer may include a fractured layer which results in a relatively rough interface with the metallic body 1140. The first and second surface roughness may be the arithmetic average roughness Ra (mean of absolute value of displacement of the surface from the mean surface height) of the respective first and second interfaces. In some embodiments, the first surface roughness is less than 1 micrometer, or less than 500 nm, or less than 200 nm, or less than 100 nm, less than 50 nm, or less 30 nm. In some embodiments, the second surface roughness is greater than 0.4 micrometers, or greater than 500 nm, or greater than 1 micrometer, or greater than 2 micrometers, or greater than 5 micrometers. In some embodiments, the second surface roughness is greater than the first surface roughness by at least 0.5 micrometers, or at least 1 micrometer, or at least 2 micrometers.

Figure 11B:
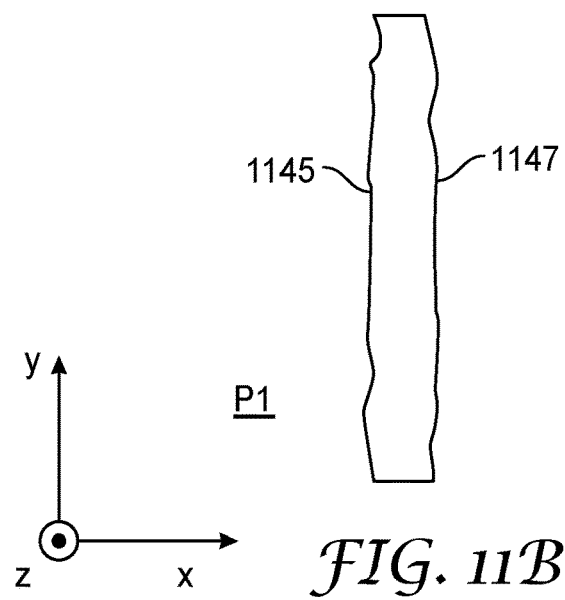

FIG. 11B is a schematic view of the metallic body 1140 in a cross-section in the plane P1. In some embodiments, in a plane P1 through the metallic body 1140 that is parallel to and spaced apart from the seed layer (disposed at the interface 1135; not illustrated in FIGS. 11A-11B), the metallic body 1140 may have a lower first line edge roughness at a first interface 1145 or 1147 with the side surfaces and the seed layer may have a higher second line edge roughness at an edge (e.g., edge 846 depicted in FIG. 8) of the conductive seed layer. The plane P1 may be taken to be about halfway between a top and a bottom of the metallic body 1140, for example. The first and second line edge roughnesses may each be Ra roughnesses (mean of an absolute value of displacement of the edge from the mean line of the edge). In some embodiments, the first line edge roughness is less than 1 micrometer, or less than 500 nm, or less than 200 nm, or less than 100 nm, less than 50 nm, or less than 30 nm. In some embodiments, the second line edge roughness is greater than 0.4 micrometers, or greater than 500 nm, or greater than 1 micrometer, or greater than 2 micrometers, or greater than 5 micrometers. In some embodiments, the second line edge roughness is greater than the first line edge roughness by at least 0.5 micrometers, or at least 1 micrometer, or at least 2 micrometers.

Figure 12B:
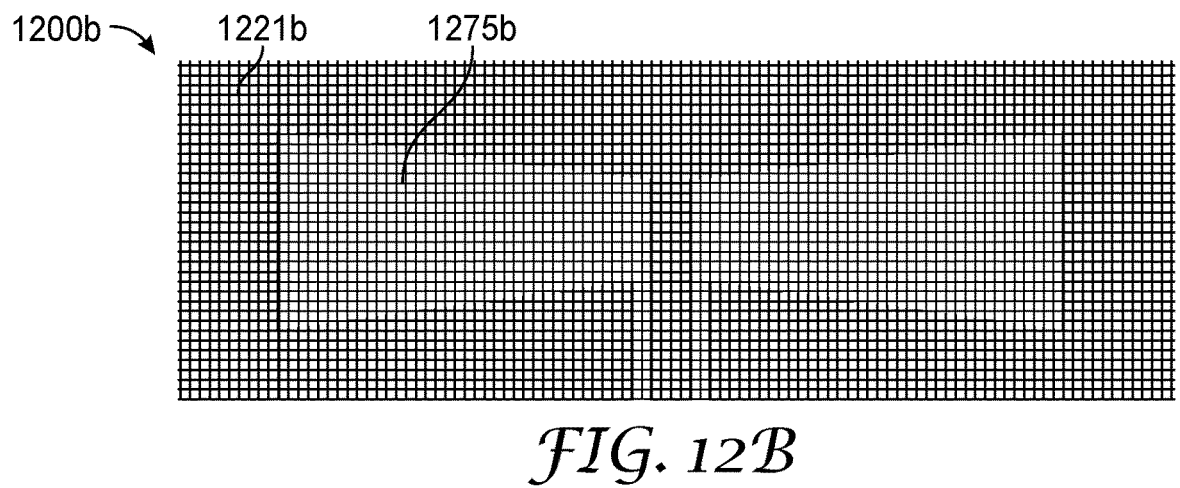

In some embodiments, a patterned article includes a micropattern of conductive traces disposed at least partially in a micropattern of grooves where the micropattern of grooves includes at least one groove filled or substantially filled (e.g., at least 60%, or at least 70%, or at least 80%, or at least 90% filled, or 100% filled, or over filled) with a non-conductive material. For example, the non-conductive material may be air or a dielectric material which can be understood be an electrically non-conductive material having a dielectric constant greater than that of air (e.g., a dielectric constant of at least 1.1 or at least 1.2 or at least 1.5 at a wavelength of 532 nm). FIG. 12A is a schematic top plan view of a patterned article 1200a which includes electrically conductive elements 1220a and 1220b which are electrically isolated from one another. Each of the electrically conductive elements 1220a and 1220b includes a micropattern of conductive traces 1221a disposed at least partially in a micropattern of grooves. The micropattern of grooves includes at least one groove 1275a (a plurality of grooves in the illustrated embodiment) filled or substantially filled with a non-conductive material. Similarly, FIG. 12B is a schematic top plan view of a patterned article 1200b which includes a micropattern of conductive traces 1221b disposed at least partially in a micropattern of grooves where the micropattern of grooves includes at least one groove 1275b (a plurality of grooves in the illustrated embodiment) filled or substantially filled with a non-conductive material.

In some embodiments, the patterned article 1200a or 1200b is an antenna. In some embodiments, the micropattern of conductive traces 1221a or 1221b is configured to provide a predetermined spectral response. For example, the micropattern may have an overall size and shape so that it can efficiently transmit and receive in a predetermined wavelength or frequency range. In some such embodiments, the micropattern of conductive traces 1221a or 1221b is configured to provide a predetermined directivity. For example, the micropattern may have an overall size and shape (e.g., a bow-tie antenna as schematically illustrated in FIG. 12A or a bow-tie slot antenna as schematically illustrated in FIG. 12B) so that it can efficiently transmit and receive in a predetermined wavelength range with a predetermined directivity (e.g., transmit more strongly along a specified direction than another direction). The patterned article may be a 5G antenna, for example, and/or may be configured to transmit and receive in a frequency band from 10, 20 or 30 GHz to 300, 200, or 100 GHz, for example (e.g., 20 to 100 GHz). Useful antenna geometries are described in U.S. Pat. Appl. Publ. Nos. 2009/0051620 (Ishibashi et al.), 2009/0303125 (Caille et al.), and 2013/0264390 (Frey et al.), for example. In some embodiments, the patterned article 1200a or 1200b is a substantially transparent antenna. For example, in some embodiments, the patterned article 1200a or 1200b is adapted to be placed on a window where it is desired to use the article as an antenna and be able to see through the antenna. In some embodiments, the substantially transparent antenna is an antenna array such as a 5G antenna array or a retrodirective antenna array (e.g., a Van Atta array). In some embodiments, a patterned article includes an array of antennas that are subsequently singulated to provide antennas corresponding to patterned article 1200a or 1200b.

Figure 13:
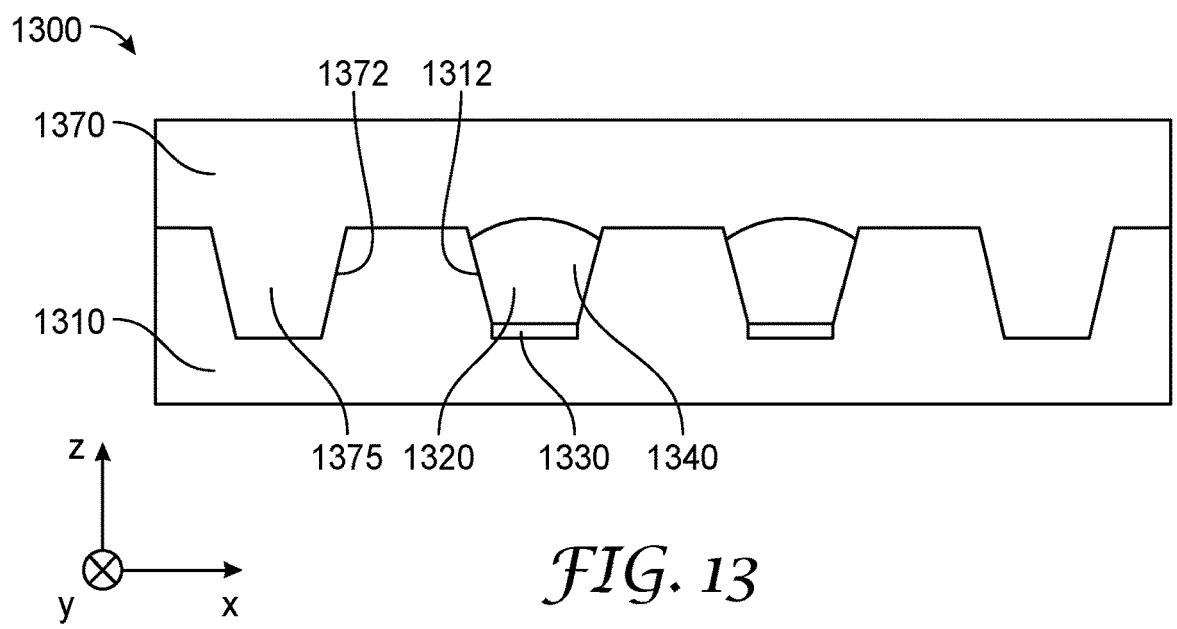
FIGS. 13-14 are schematic cross-sectional views of illustrative patterned articles.

FIG. 13 is a schematic cross-sectional view of a patterned article 1300 or a portion of the article 1300 that may correspond to patterned article 1200a or 1200b, for example. The patterned article 1300 includes a layer 1310 (e.g., a unitary top layer of a substrate) including a pattern of cavities or grooves (e.g., a micropattern of grooves) which includes a first cavity or groove 1312 and a second cavity or groove 1372. First cavity or groove 1312 includes conductive element 1320, which can be a trace or other conductive element, and which includes a metallic body 1340 (e.g., a unitary metallic body) disposed on a conductive seed layer 1330. Second cavity or groove 1372 may be substantially filled with a material 1375 which may be substantially transparent and/or non-conductive. For example, a micropattern of grooves may be provided with conductive traces in some of the grooves as described further elsewhere herein and then a coating 1370 may be applied to over the grooves such that the material 1375 of the coating 1370 fills or substantially fills grooves not containing traces. In some embodiments, in a least one cross-section orthogonal to a length of the second cavity or groove 1372, the second cavity or groove 1372 is substantially filled with a substantially transparent material. In some embodiments, the material 1375 is a dielectric material disposed on the top major surface of the unitary polymeric layer 1310 and covering the metallic bodies 1340.

The material 1375 may be a non-conductive material and/or a substantially transparent material and may be one or more of an adhesive, a polymer, or a dielectric material (e.g., a polymeric optically clear adhesive). In some embodiments, the material 1375 has a refractive index within 0.02 of a refractive index of the layer 1310. The refractive index is determined at a wavelength of 587.6 nm (spectral line from helium source), unless specified differently.

Figure 14:
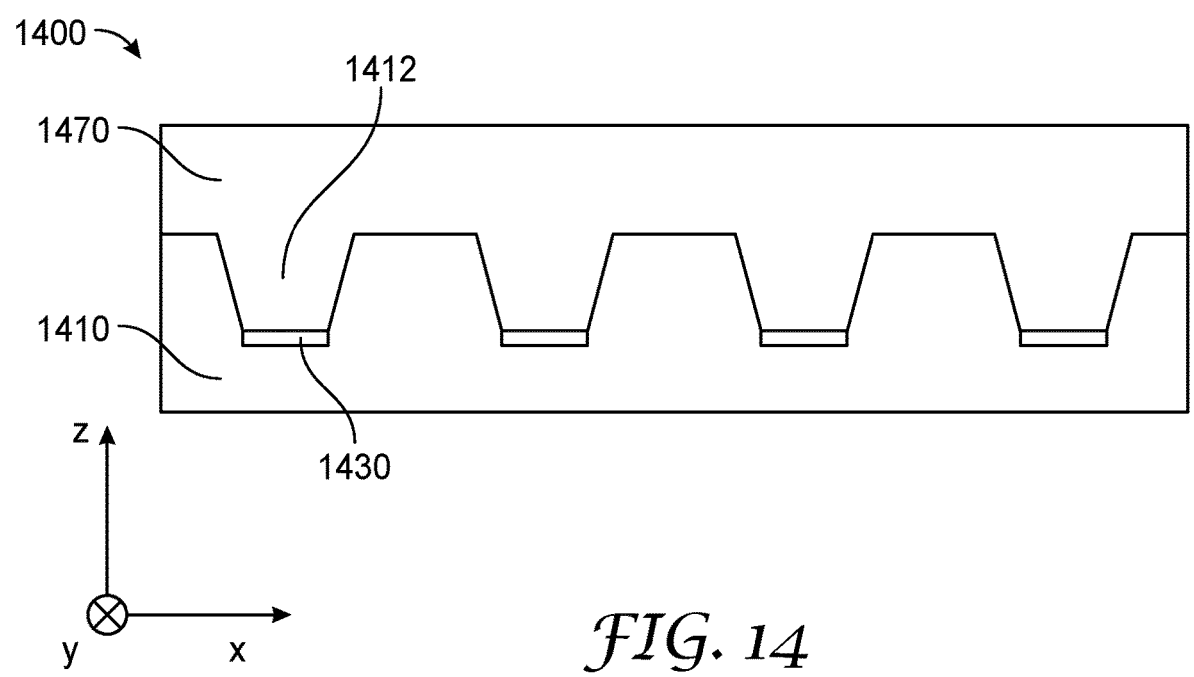

FIG. 14 is a schematic cross-sectional view of a patterned article 1400 or a portion of the article 1400. The patterned article 1400 includes a layer 1410 (e.g., a unitary layer of a substrate) including a first cavity or groove 1412 (e.g., a groove in a micropattern of grooves) which may extend along a longitudinal direction (y-direction) and has bottom surface and side surfaces. First cavity or groove 1412 includes a unitary conductive layer 1430 disposed in the first cavity or groove. In some embodiments, in at least one cross-section of the first cavity or groove (e.g., perpendicular to the longitudinal direction), the conductive layer covers at least a majority of the bottom surface of the first cavity or groove, and at least a majority of the side surfaces of the first cavity or groove does not contact material having a same composition as that of the conductive layer. In some embodiments, the unitary conductive layer 1430 may be used as the conductive element (e.g., without plating a metallic body onto the conductive layer 1430). This may be desired in applications where the conductive layer 1430 provides sufficient conductivity and where the durability of the conductive layer 1430 is improved by disposing the layer at the bottom surface of the cavity or groove.

In some embodiments, a nonmetallic material 1470 is disposed at least partially in the first cavity or groove 1412. In some embodiments, in the at least one cross-section of the first cavity or groove, the nonmetallic material 1470 covers at least a majority of the side surfaces of the first cavity or groove 1412. In the illustrated embodiment, the nonmetallic material 1470 forms a continuous layer which fills the first cavity or groove 1412 (and fills other cavities grooves). For example, the nonmetallic material 1470 may be one or more of an adhesive, a polymer, or a dielectric material (e.g., a polymeric optically clear adhesive) that forms a continuous layer filling in each groove. In some embodiments, the material 1470 has a refractive index within 0.02 of a refractive index of the layer 1410. In some embodiments, the material 1470 is substantially transparent. In some embodiments, the material 1470 is disposed substantially only in the cavity grooves in the layer 1410 (e.g., a portion of a coated material above the grooves may be wiped off). In some embodiments, the material 1470 is electrically conductive (e.g., a transparent electrically conductive polymer such as poly(3,4-ethylenedioxythiophene) (PEDOT), PEDOT polystyrene sulfonate (PEDOT:PSS), or poly(4,4-dioctylcyclopentadithiophene)).

Busbar(s) may be used to electrically connect the electrically conductive elements, or the seed layers of the electrically conductive elements, to provide a common ground or common potential during an electroplating process, for example. As such, the busbar(s) may alternatively be referred to as ground line(s) or conductive common line(s). The busbar(s) may subsequently be removed from the patterned article or may subsequently be disconnected from the electrically conductive elements. In embodiments where busbar(s) are disconnected from the electrically conductive elements, the busbar(s) may still be referred to as busbar(s) even though the busbar(s) are no longer electrically connected to the conductive elements. In some embodiments, the busbar(s) provide an active part of the functionality of the patterned article.

FIG. 15 is a schematic top plan view of a patterned article 1500 according to some embodiments. The patterned article 1500 includes a plurality of electrically conductive elements 10 embedded at least partially in a unitary polymeric layer 17. Each electrically conductive element 10 (and optionally busbar 15) can include a conductive seed layer disposed in a cavity in the polymeric layer and a metallic body disposed on the conductive seed layer as described further elsewhere herein. In the illustrated embodiment, each conductive element 10 includes a plurality of conductive bodies 11 electrically connected to one another through conductive segments 12. The conductive bodies 11 can be sold bodies or can be composed of a micropattern of conductive traces, for example. Similarly, the conductive segments 12 can be solid bodies or can be composed of a micropattern of conductive traces, for example.

Figure 16:
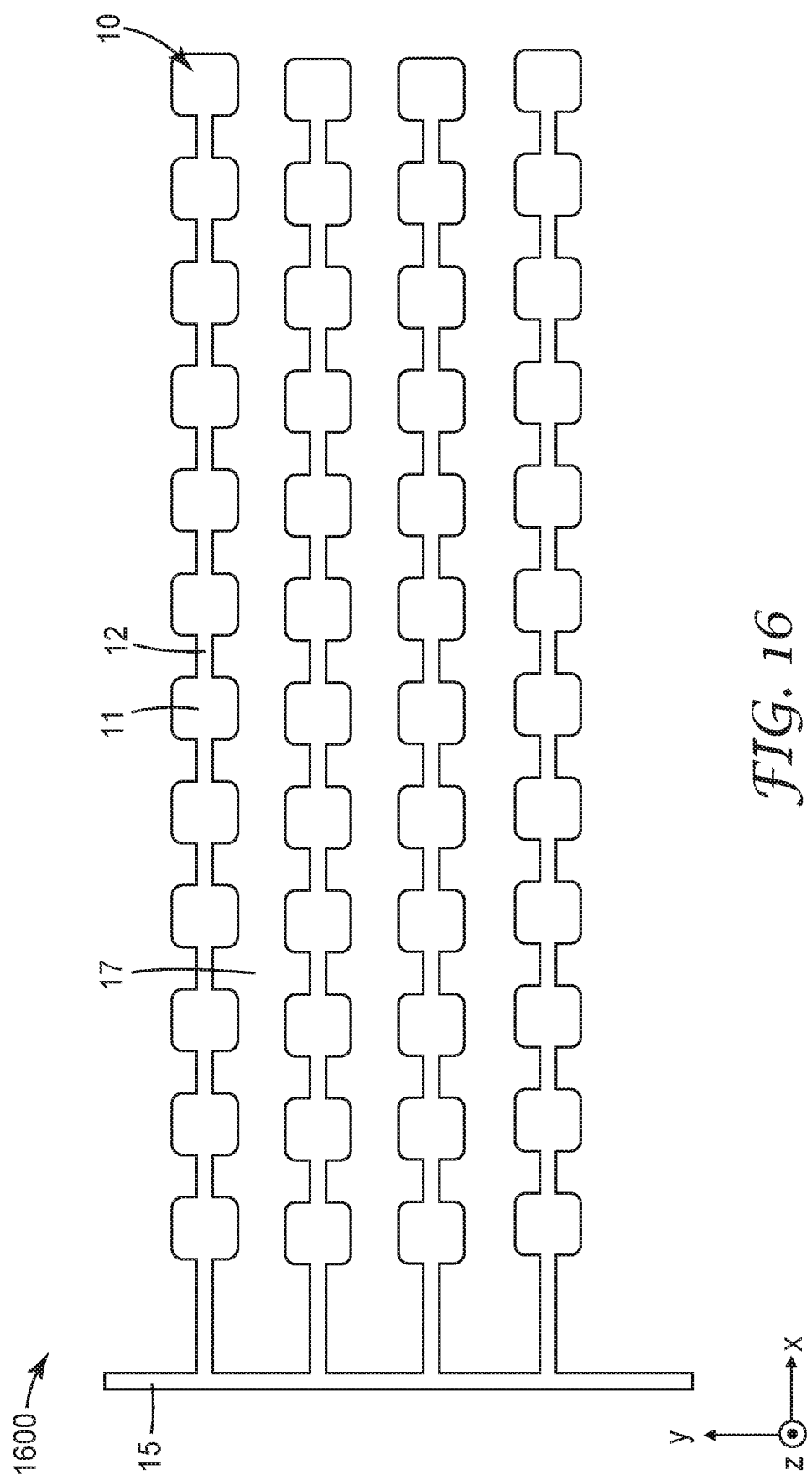

The conductive elements 10 are electrically isolated from one another in the illustrated embodiment. A busbar 15 that is electrically disconnected from the conductive elements 10 is also schematically illustrated in FIG. 15. The busbar 15 can be at least partially embedded in the unitary polymeric layer 17 and can include a conductive seed layer and a metallic body disposed on the seed layer as described elsewhere. In some embodiments, the patterned article 1500 is formed initially with the conductive elements 10 electrically connected to one another via the busbar 15. This is schematically illustrated in FIG. 16 where the patterned article 1600 includes the electrically conductive elements 10 being electrically connected to one another only by virtue of the busbar 15. The busbar can be included to electrically connect the conductive elements so that metallic bodies can be electroplated on the conductive seed layer, as described elsewhere herein, in a single step. The conductive elements are subsequently disconnected from the busbar 15 such that the disconnected conductive elements 10 are electrically isolated from one another as shown in FIG. 15, for example. The busbar can be disconnected by etching (e.g., chemical or plasma etching), for example. In some embodiments, the busbar can be removed from the patterned article. In some embodiments, the busbar is disconnected by film slitting or die cutting, for example. In some cases, the conductive elements 10 and the busbar 15 can be described as being disposed at least partially in a same cavity (e.g., having a same general shape in top plan view as the combination of conductive elements 10 and busbar 15). In some cases, each of the conductive elements 10 and the busbar 15 can be described as being disposed at least partially in its own cavity where the cavity of each of the conductive elements 10 is connected to the cavity of the busbar 15.

Figure 17:
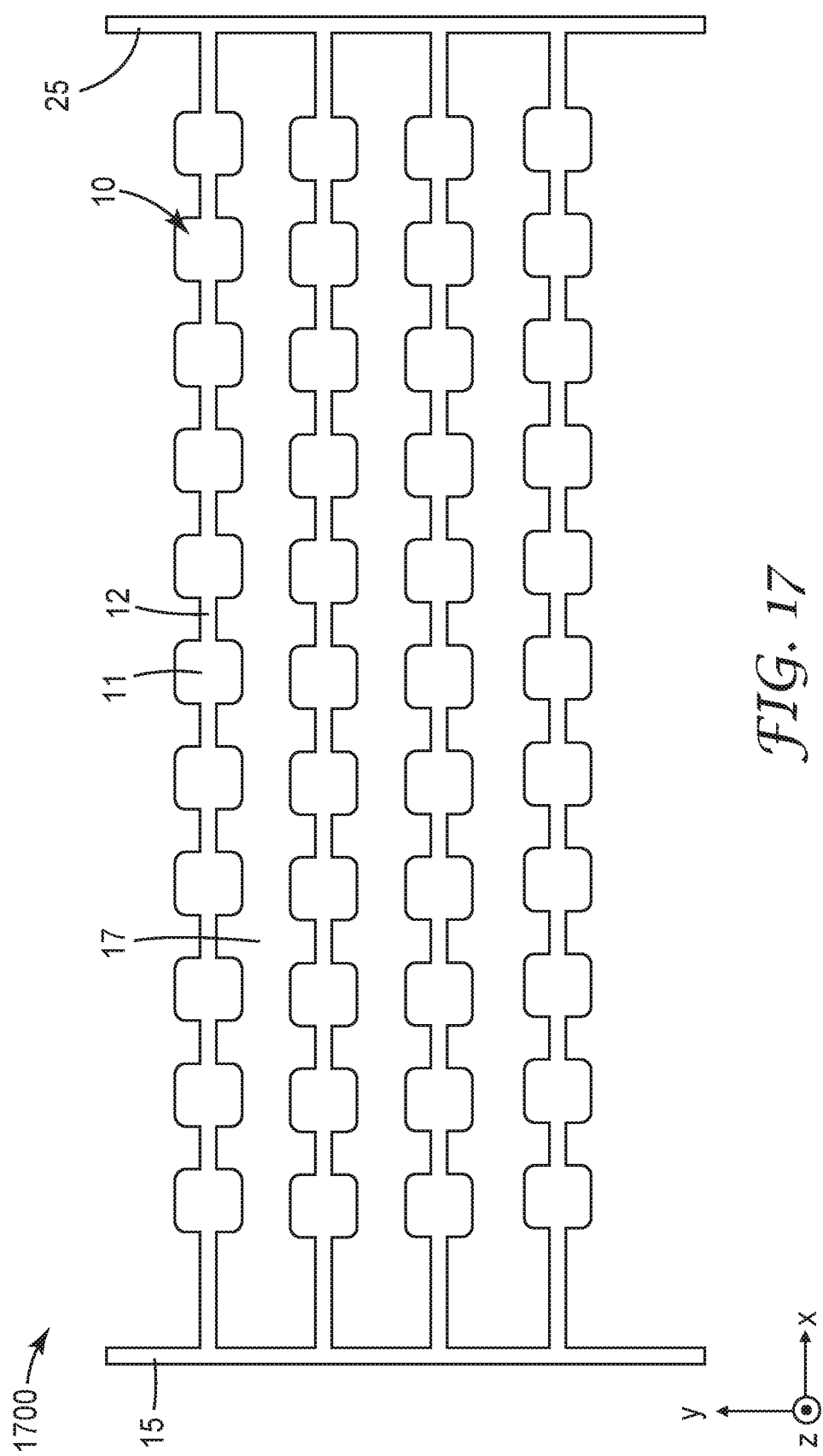

In some embodiments, more than one busbar is included. FIG. 17 is a schematic top plan view of a patterned article 1700 including a plurality of electrically conductive elements 10 embedded at least partially in the unitary polymeric layer 17 and being electrically connected to one another only by virtue of busbars 15 and 25.

In some embodiments, a busbar is included at a position such that electrically conductive elements are disposed on opposing sides of the busbar. FIG. 17 is a schematic top plan view of a patterned article 1700 including a plurality of electrically conductive elements 10 embedded at least partially in the unitary polymeric layer 17 and being electrically connected to one another only by virtue of busbar 35. In the illustrated embodiment, sub-pluralities of the conductive elements 10 (i.e., more than one and less than all of the conductive elements) are disposed on opposing sides of the busbar 35.

Figure 18:
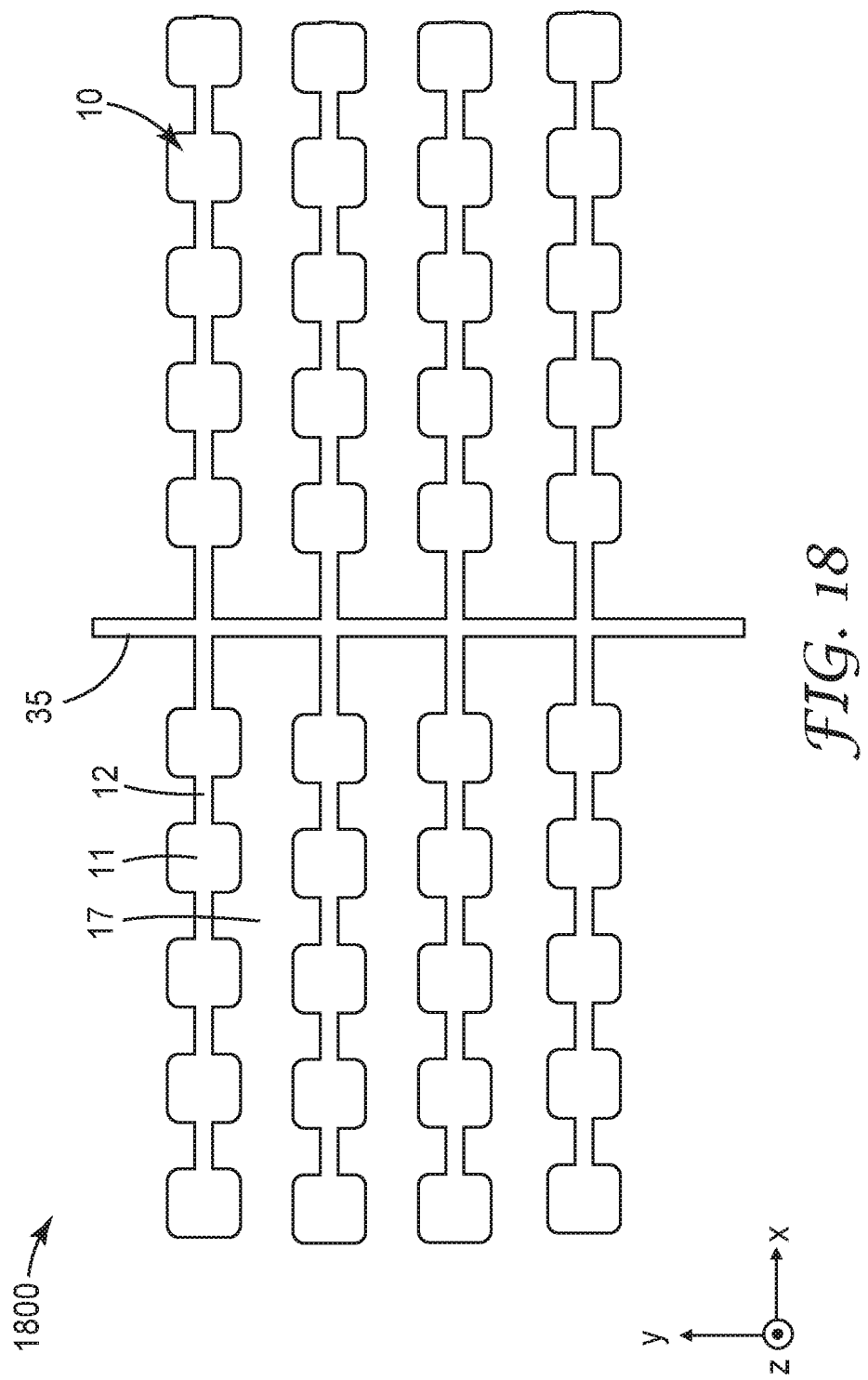

Any suitable number of busbars can be included. For example, busbars (e.g., 15, and/or 25) at one or both ends of the conductive elements 10 and one or more busbars (e.g., 35) separating sub-pluralities of the conductive elements can be included. In some embodiments, one or more busbars are included such that for each busbar, each of the electrically conductive elements is disposed on a same side of the busbar (e.g., as schematically illustrated in FIGS. 15-17) or sub-pluralities of the electrically conductive elements are disposed on opposing sides of the busbar (e.g., as schematically illustrated in FIG. 18). In some embodiments, for each busbar, the plurality of electrically conductive elements 10 is disposed on a same side of the busbar. In some such embodiments, or in other embodiments, the one or more busbars includes two parallel spaced apart busbars. In some embodiments, for at least one each busbar, sub-pluralities of the electrically conductive elements are disposed on opposing sides of the busbar.

In some embodiments, the unitary polymeric layer 17 extends along orthogonal first and second directions (x- and y-directions), the electrically conductive elements 10 extend along the first direction (x-direction), and the one or more busbars extend along the second direction (y-direction). In some embodiments, the electrically conductive elements 10 extend primarily along the first direction (e.g., extends more along the first direction than the second direction), while in other embodiments, the electrically conductive elements 10 extend as much or more in the second direction as the in the first direction. The one or more busbars can extend primarily along the second direction. When more than one busbars are included, the busbars can be parallel to one another.

In some embodiments, a patterned article (e.g., 1600, 1700, 1800, 300, 200, 100) includes a unitary polymeric layer (e.g., 17, 310, 210-1, 110) a plurality of electrically conductive elements (e.g., 10, 320, 220, 120) embedded at least partially in the unitary polymeric layer. The electrically conductive elements (e.g., 10) are electrically connected to one another only by virtue of one or more busbars (e.g., 15, 25, 35) embedded at least partially in the unitary polymeric layer such that for each busbar, each of the electrically conductive elements is disposed on a same side of the busbar or sub-pluralities of the electrically conductive elements are disposed on opposing sides of the busbar. The unitary polymeric layer may extend along orthogonal first and second directions (x- and y-directions), the electrically conductive elements may extend along the first direction, and the one or more busbars may extend along the second direction. The one or more busbars can be one busbar or a plurality of nonintersecting busbars. The busbar(s) can be or include straight conductive line(s), curved conductive line (s), or straight or curved conductive segments, for example. Each electrically conductive element (and optionally each busbar) includes a conductive seed layer (e.g., 330, 230) having a top major surface (e.g., 235) and an opposite bottom major surface (e.g., 234) in direct contact with the unitary polymeric layer (e.g., 310, 210-1); and a metallic body (e.g., 340, 240) disposed on the top major surface of the conductive seed layer. The metallic body has a bottom major surface (e.g., 393, 293) and at least one sidewall (e.g., 242, 244). The bottom major surface (e.g., 393, 293) contacts the conductive seed layer. Each sidewall is in direct contact with the unitary polymeric layer and extends from the bottom major surface (e.g., 393, 293) of the metallic body toward or to, but not past, a top major surface (e.g., 311, 211) of the unitary polymeric layer.

FIG. 19 is a schematic top plan view of an illustrative patterned article 1900 including a plurality of electrically conductive elements 20 embedded at least partially in a unitary polymeric layer 17 and being electrically isolated from one another. In the illustrated embodiment, the conductive elements 20 included first, second and third conductive elements 20a, 20b, and 20c, respectively. Each of the conductive elements 20 are generally U-shaped in the illustrated embodiment. The patterned article 1900 may be a retrodirective antenna array (e.g., a Van Atta array), for example. The patterned article 1900 can be made as described elsewhere herein using a busbar to the left (negative x-direction) of the conductive elements 20 which is subsequently removed.

In some embodiments, the plurality of electrically conductive elements 20 includes first and second conductive elements 20a and 20b such that in a top plan view of the patterned article 1900, the first conductive element 20a is disposed at least partially in a smallest rectangle 22b containing the second conductive element 20b. In some embodiments, the plurality of electrically conductive elements 20 further includes a third conductive element 20c such that in the top plan view of the patterned article, the second conductive element 20b is disposed at least partially in a smallest rectangle 22c containing the third conductive element 20c. In some embodiments, in a top plan view, the second conductive element 20b is disposed entirely outside a smallest rectangle 22a containing the first conductive element 20a. In some embodiments, in a top plan view, the third conductive element 20c is disposed entirely outside the smallest rectangle 22b containing the second conductive element 20b.

EXAMPLES

Preparation of UV Curable Resin 75 parts PHOTOMER 6210 (available from Cognis (Monheim am Rhein, Germany)), 25 parts hexanediol diacrylate, SARTOMER SR238 (available from Sartomer USA (Exton, PA)), and 0.5% of LUCIRIN TPO (available from BASF (Ludwigshafen, Germany)) were blended with a high-speed mixer, and then heated in an oven at 160° F. (71° C.) for 24 hours. The compounded resin was subsequently cooled to room temperature.

Patterned Article 1

Molding of VISTAMAXX Tool Including Linear Channel Array 1 layer of VISTAMAXX 3588, 0.47 mm thick sheet (available from ExxonMobile Chemical, Houston TX) was placed on metal tooling containing linear ribs that were 40 μm wide on a 125 μm pitch, and that were 81 μm tall. The films were 250 mm×280 mm in size. The samples were pressed in a compression molder Rucker PHI 400 ton (City of Industry, CA) to form molded tools. The molding conditions used were as follows:

Temperature: 225° F.
Low pressure: 6,000 lbs; Time: 1 min
Raised low pressure: 80,000 lbs; Time: 20 min
Cooled to nominally 100° F.

Silver Transfer Layer Preparation

A transferrable thin seed layer film was made on a vacuum coater similar to the coater described in U.S. Pat. No. 8,658,248 (Anderson et al.) and U.S. Pat. No. 7,018,713 (Padiyath, et al.). This coater was threaded up with a substrate in the form of an indefinite length roll of 980 microinch (0.0250 mm) thick, 14 inch (35.6 cm) wide aluminized biaxially-oriented polypropylene film under the trade name TorayFAN PMX2 commercially available from Toray Plastics (America), Inc. (North Kingstown, RI). This substrate was then advanced at a constant line speed of 32 fpm (9.8 m/min).

A first organic layer was formed on the substrate by applying an acrylate liquid based on tricyclodecane dimethanol diacrylate, under the trade name of SARTOMER SR833S from Sartomer USA (Exton, PA), by ultrasonic atomization and flash evaporation to make a coating width of 12.5 inches (31.8 cm). This monomeric coating was subsequently cured immediately downstream with an electron beam curing gun operating at 7.0 kV and 10.0 mA. The flow of liquid monomer into the evaporator was 0.67 ml/min, the nitrogen gas flow rate was 100 sccm and the evaporator temperature was set at 500° F. (260° C.). The process drum temperature was 14° F. (−10° C.).

On top of this first organic layer, a silver reflector layer was deposited by DC sputtering of a >99% silver cathode target. The system was operated at 3 kW with a 30 fpm (9.1 meters per minute) line speed. Two subsequent depositions with the same power and line-speed were done to create a 90 nm layer of silver.

On top of this silver layer, an oxide layer of silicon aluminum oxide was deposited by AC reactive sputtering. The cathode had a Si(90%)/Al(10%) target obtained from Soleras Advanced Coatings US, of Biddeford, (ME). The voltage for the cathode during sputtering was controlled by a feed-back control loop that monitored the voltage and controlled the oxygen flow such that the voltage would remain high and not crash the target voltage. The system was operated at 16 kW of power to deposit a 12 nm thick layer of silicon aluminum oxide onto the silver reflector.

Similar to what is described in PCT Publ. Nos. WO 2018/178802 (Gotrik et al.) or WO 2018/178803 (Gotrik et al.), the aluminum surface of the TorayFAN PMX2 film and the first organic layer was expected to decouple with a 180 Peel force of about 7.2 g/in (0.28 g per mm).

Procedure for Double layer Transfer

The equipment used in this process included compression molded VISTAMAXX tool samples, a roll of the silver transfer film described above, one roll of 2 mil polyethylene terephthalate (PET) film with one side primed, UV Curable Resin, one rubber hand-roller with 0.6 in. (1.52 cm) of diameter and 9 in. (22.9 cm) of length, MASTER HEAT GUN model HG-501A, and OMEGA Type J thermocouple, RPC Industries (Hampton, VA) UV Processor (Model QC120233AN), plastic transfer pipette, and 11 in. by 15 in. (27.9 cm by 38.1 cm) metal plate.

A VISTAMAXX tool was provided in 8.5 in by 9.5 in (21.5 cm by 24.1 cm) sheet which was set on a flat surface with the micro-structure facing up. A silver transfer layer film was cut into 10 in by 11 in (25.4 cm by 27.9 cm by) pieces. Hot air from heat gun was distributed evenly to the surface of the sample to heat up to 150° C. Since the sample deforms under high temperature, the surface temperature was monitored using the thermocouple. When the desired temperature was reached, hot air was disconnected, and the silver transfer layer film was placed on the heated VISTAMAXX film, with the silver transfer layer facing down. The sample was hand laminated once by applying a gentle force using the rubber hand roller. The silver transfer layer was immediately pulled away from the VISTAMAXX sample and was found to be lightly attached to the tops of the ribs but not where the open channels between the ribs was located. The quality of the silver transfer layer transfer was evaluated under optical microscope and found to have electrical continuity.

After the silver transfer layer was transferred to the VISTAMAXX tool, it was transferred to a resin layer as follows. The UV processor was turned on following the instruction manual with lamp at normal setting and the conveyor belt speed of 50 RPM. The VISTAMAXX sample with silver transfer layer was taped down on a metal plate. With a transfer pipette, a line of UV Curable Resin was dispensed on one side of the sample. Primed 2 mil PET film was cut into 10 in by 11 in (25.4 cm by 27.9 cm by) piece which was stacked on top of the VISTAMAXX sample with the primed side facing down. The sample was laminated with the rubber hand roller slowly to remove entrapped air bubbles between the VISTAMAXX and PET films. Afterward, the sample was delivered through the UV processor twice under inert gas to drive the curing process to completion. The PET film was detached slowly from the VISTAMAXX tool. The quality of silver transfer layer transfer to polymer film was assessed under optical microscope. The silver transfer layer transferred completely to the bottom of the UV cured film. The samples were stored at ambient condition for more than 24 hours before further analysis.

Procedure for RIE Removal of the Dielectric Layer from the Transferred Layer

A commercial batch plasma system (Plasma-Therm (Petersburg, Fla.) Model 3032) with a 26-inch lower powered electrode and central gas pumping was used to remove the dielectric layer (silicon aluminum oxide layer) via reactive ion etching (RIE). The chamber was pumped by a roots blower (Edwards (Burgess Hill, UK) Model EH1200) backed by a dry mechanical pump (Edwards Model iQDP80). RF power was delivered by a 5 kW, 13.56 Mhz solid-state generator (RF Plasma Products Model RF50S0) through an impedance matching network. The system had a nominal base pressure of 5 mTorr. The flow rates of the gases were controlled by MKS flow controllers (available from MKS Instruments, Andover, MA).

Samples of the substrates were fixed on the powered electrode of the batch plasma apparatus. The plasma etching was completed by feeding 500 SCCM of oxygen into the chamber after evacuating the chamber to <10 mTorr. Once the flows were stabilized, the rf power was applied to the electrode to generate the plasma at 1000 W. The plasma was left on for 15 seconds.

After the plasma treatment was completed, the chamber was vented to atmosphere and the substrates were taken out of the chamber.

Copper Plating within the Grooves

The RIE etched film was rinsed with DI water and put into a solution composed of copper sulfate (217.5 gram/liter) and sulfuric acid (60 gram/liter). The solution flow rate was 0.7 liter/second. The plating was conducted with a power supply made by DYNATRONIX (Amery WI), Model DPR20-250-500, in a potentiostatic mode. The solution temperature was 21° C. The plating was controlled at 1.6V for 25 min. After the plating, the part was rinsed, dried, and examined under microscopy. Copper was confirmed to plate on the silver transfer layer where the dielectric layer had been removed by RIE etching.

Patterned Articles 2-3

Procedure for Seeding a Tool with NovaCentrix Conductive Ink

Conductive silver ink was applied to the top of the ribs on a structured nickel tool by hand printing. The nickel tool had a hexagonal portion and a triangular portion (e.g., corresponding to a busbar portion). The hexagonal portion included hexagons having a width across opposing parallel sides of 1 mm, a rib width of 25 micrometers, and a rib height of 25 micrometers. The triangular portion included hexagons have the same geometry of the hexagonal portion and included additional ribs extending from each vertex of the hexagon to a center of the hexagon. The conductive silver ink was applied as follows:

(1) A continuous layer of NovaCentrix (Round Rock, TX) DSPI-420 Silver Dispersing Ink was prepared as an ink source by coating it onto PET film with a #5 Mayer Rod, producing a wet film thickness of approximately 10 μm.

(2) A flat photopolymer flexographic printing plate, was mounted to a ~4 inch diameter mandrel with 3M E1120 CUSHION-MOUNT tape (available from 3M Company, St. Paul, MN), was immediately hand rolled over the coating of (1), transferring a portion of silver ink to the surface of the flexographic printing plate before drying.

(3) The flexographic printing plate of (2) was then immediately hand-rolled over the surface of the nickel tool, transferring silver ink only to the upper relief surface of the structured nickel tool, before the silver ink dried on the printing plate surface.

The silver ink was then dried and sintered for at least 2 minutes at 240° F., using a Despatch (Minneapolis, MN) solvent-rated oven (Model LFC1-38-1).

Procedure for Film Formation

Equipment used in the process included a Fusion UV Processor run at ~10 ft/min, curing with an H-bulb, ChemInstruments (Chester Township, OH) laminator (Model: Hot Roll Laminator), and 5 mil PET film with both sides primed.

To initiate the process, PET film was cut into approximately 6.5 in. by 7.5 in. (16.5 cm by 19.1 cm) pieces to cover the entire surface of the tool. The UV processor was turned on following the instruction manual with lamp at normal setting and the conveyor belt speed of 50 RPM. Nitrogen gas was also supplied to the UV processor to assist the curing process.

Using a plastic transfer pipette, the UV Curable Resin was dispensed on the edge of the tool. The PET film was placed on top of the tool, which was held in place by taping one end to the tool. The sample was processed through a laminator which spread the resin uniformly across the tool.

The sample was then run through the UV processor twice to ensure that the resin cure to completion. The sample was removed from the tool by gently pulling the samples away at a 90° angle. The resultant film was a reverse image microstructure from the tool, with sintered silver seed layers at the bottom of the grooves.

Procedure for Copper Plating

The replicated film described above was put into an acidic copper plating solution composed of copper sulfate and sulfuric acid. The solution flow rate was 1.3 liter/second. The plating was conducted with a power supply made by DYNATRONIX (Amery WI), Model CRS12-200, in a potentiostatic mode. The solution temperature was 21° C. The plating was controlled at 1.4V for 12.5 min and 10 min, respectively, for Examples 2 and 3. After the plating, the part was rinsed, dried, and examined under microscopy. It was confirmed that copper was plated onto the seed layers in the groove to form a micropattern of conductive traces.

For Patterned Article 2: In the hexagonal portion, the traces extended above the top surface of the UV cured layer by approximately 15 to 22 micrometers. In the triangular portion, the tops of the traces were approximately level with the top surface of the UV cured layer.

For Patterned Article 3: In the hexagonal portion, the tops of the traces were approximately level with the top surface of the UV cured layer by about 20 micrometers. In the triangular portion, the tops of the traces recessed by approximately 15 to 21 micrometers from the top surface of the UV cured layer.

Exemplary patterned articles including a plurality of electrically isolated conductive elements are made as described for Patterned Articles 1-3 except that the tool is structured to produce electrically conductive elements being electrically connected to one another only by virtue of one or more busbars. For example, the tool can be structured to produce a pattern such as any of those shown schematically shown in any of FIGS. 16-18. The conductive elements are then electrically disconnected from the one or more busbars. The resulting patterned articles can be as schematically illustrated in FIG. 15 or 19, for example.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A patterned article comprising:
a unitary polymeric layer; and
a plurality of electrically conductive elements embedded at least partially in the unitary polymeric layer and being electrically isolated from one another, each electrically conductive element comprising:
a conductive seed layer having a top major surface and an opposite bottom major surface in direct contact with the unitary polymeric layer, the conductive seed layer comprising a monolithic metal layer; and a metallic body disposed on the top major surface of the conductive seed layer, the metallic body having a bottom major surface and at least one sidewall, the bottom major surface contacting the conductive seed layer, each sidewall being in direct contact with the unitary polymeric layer and extending from the bottom major surface of the metallic body toward or to, but not past, a top major surface of the unitary polymeric layer, wherein at least some of the electrically conductive elements comprise a micropattern of conductive traces having an open area fraction in a range of 80% to 99.95%.

2. The patterned article of claim 1, wherein the plurality of electrically conductive elements comprises first and second conductive elements such that in a top plan view of the patterned article, the first conductive element is disposed at least partially in a smallest rectangle containing the second conductive element.

3. The patterned article of claim 2, wherein the plurality of electrically conductive elements further comprises a third conductive element such that in the top plan view of the patterned article, the second conductive element is disposed at least partially in a smallest rectangle containing the third conductive element.

4. The patterned article of claim 1, wherein the plurality of electrically conductive elements defines an antenna.

5. The patterned article of claim 4, wherein the antenna comprises a retrodirective antenna array.

6. The patterned article of claim 1 further comprising a dielectric layer disposed on the top major surface of the unitary polymeric layer and covering the metallic bodies.

7. The patterned article of claim 1, wherein each of the electrically conductive elements comprises a micropattern of conductive traces.

8. The patterned article of claim 7, wherein each of the micropatterns of conductive traces has an open area fraction in a range of 80% to 99.95%.

9. The patterned article of claim 1, wherein each conductive trace in at least a majority of the conductive traces in the micropattern extends along a longitudinal direction of the conductive trace, has a width W along a width direction orthogonal to the longitudinal direction and to a thickness direction of the unitary polymeric layer, and has a thickness T along the thickness direction, T/W being at least 0.8.

10. A patterned article comprising:
a unitary polymeric layer extending along orthogonal first and second directions; and
a plurality of electrically conductive elements embedded at least partially in the unitary polymeric layer and extending along the first direction, the electrically conductive elements being electrically connected to one another only by virtue of one or more busbars extending along the second direction and embedded at least partially in the unitary polymeric layer such that for each busbar, each of the electrically conductive elements is disposed on a same side of the busbar or sub-pluralities of the electrically conductive elements are disposed on opposing sides of the busbar, each electrically conductive element comprising:
a conductive seed layer having a top major surface and an opposite bottom major surface in direct contact with the unitary polymeric layer, the conductive seed layer comprising a monolithic metal layer; and
a metallic body disposed on the top major surface of the conductive seed layer, the metallic body having a bottom major surface and at least one sidewall, the bottom major surface contacting the conductive seed layer, each sidewall being in direct contact with the unitary polymeric layer and extending from the bottom major surface of the metallic body toward or to, but not past, a top major surface of the unitary polymeric layer.

11. The patterned article of claim 10, wherein for each busbar, the plurality of electrically conductive elements is disposed on a same side of the busbar.

12. The patterned article of claim 10, wherein the one or more busbars comprises two parallel spaced apart busbars.

13. A process of making a patterned article, the process comprising:
providing a tool comprising at least one raised portion;
disposing a conductive layer on a top surface of a first portion of the at least one raised portion such that at least a majority of a total area of side surfaces of the first portion of the at least one raised portion is free of the conductive layer, the conductive layer comprising a monolithic metal layer;
disposing a polymer or polymer precursor onto the tool after the disposing the conductive layer step;
solidifying the polymer or polymer precursor to form a polymeric layer comprising at least one cavity corresponding to the at least one raised portion;
removing the polymeric layer and the conductive layer from the tool such that the conductive layer is disposed at a bottom surface of the at least one cavity;
depositing conductive material into the at least one cavity such that the conductive material covers the conductive layer, the conductive material and conductive layer defining a plurality of conductive elements electrically connected to one another via one or more busbars; and
disconnecting the conductive elements from the one or more busbars such that the disconnected conductive elements are electrically isolated from one another.

14. The process of claim 13, wherein the polymer or polymer precursor comprises a molten polymer, and wherein solidifying the polymer or polymer precursor comprises cooling the molten polymer.

15. The process of claim 13, wherein the polymer or polymer precursor comprises a resin, and solidifying the polymer or polymer precursor comprises curing the resin.

16. A patterned article comprising:
a unitary polymeric layer; and
a plurality of electrically conductive elements embedded at least partially in the unitary polymeric layer and being electrically isolated from one another, each electrically conductive element comprising:
a conductive seed layer having a top major surface and an opposite bottom major surface in direct contact with the unitary polymeric layer; and
a metallic body disposed on the top major surface of the conductive seed layer, the metallic body having a bottom major surface and at least one sidewall, the bottom major surface contacting the conductive seed layer, each sidewall being in direct contact with the unitary polymeric layer and extending from the bottom major surface of the metallic body toward or to, but not past, a top major surface of the unitary polymeric layer, wherein at least some of the electrically conductive elements comprise a micropattern of conductive traces having an open area fraction in a range of 80% to 99.95%,
wherein the plurality of electrically conductive elements comprises first, second, and third conductive elements such that in a top plan view of the patterned article, the first conductive element is disposed at least partially in a smallest rectangle containing the second conductive element, and the second conductive element is disposed at least partially in a smallest rectangle containing the third conductive element.

17. The patterned article of claim 16, wherein each conductive trace in at least a majority of the conductive traces in the micropattern extends along a longitudinal direction of the conductive trace, has a width W along a width direction orthogonal to the longitudinal direction and to a thickness direction of the unitary polymeric layer, and has a thickness T along the thickness direction, T/W being at least 0.8.

18. A patterned article comprising:
a unitary polymeric layer; and
a plurality of electrically conductive elements embedded at least partially in the unitary polymeric layer and being electrically isolated from one another, each electrically conductive element comprising:
a conductive seed layer having a top major surface and an opposite bottom major surface in direct contact with the unitary polymeric layer; and
a metallic body disposed on the top major surface of the conductive seed layer, the metallic body having a bottom major surface and at least one sidewall, the bottom major surface contacting the conductive seed layer, each sidewall being in direct contact with the unitary polymeric layer and extending from the bottom major surface of the metallic body toward or to, but not past, a top major surface of the unitary polymeric layer, wherein at least some of the electrically conductive elements comprise a micropattern of conductive traces having an open area fraction in a range of 80% to 99.95%,
wherein the plurality of electrically conductive elements defines an antenna, the antenna comprising a retrodirective antenna array.

19. The patterned article of claim 18, wherein each conductive trace in at least a majority of the conductive traces in the micropattern extends along a longitudinal direction of the conductive trace, has a width W along a width direction orthogonal to the longitudinal direction and to a thickness direction of the unitary polymeric layer, and has a thickness T along the thickness direction, T/W being at least 0.8.

20. A patterned article comprising:
a unitary polymeric layer extending along orthogonal first and second directions; and
a plurality of electrically conductive elements embedded at least partially in the unitary polymeric layer and extending along the first direction, the electrically conductive elements being electrically connected to one another only by virtue of one or more busbars extending along the second direction and embedded at least partially in the unitary polymeric layer such that for each busbar, each of the electrically conductive elements is disposed on a same side of the busbar, each electrically conductive element comprising:
a conductive seed layer having a top major surface and an opposite bottom major surface in direct contact with the unitary polymeric layer; and
a metallic body disposed on the top major surface of the conductive seed layer, the metallic body having a bottom major surface and at least one sidewall, the bottom major surface contacting the conductive seed layer, each sidewall being in direct contact with the unitary polymeric layer and extending from the bottom major surface of the metallic body toward or to, but not past, a top major surface of the unitary polymeric layer.

* * * * *